United States Patent
Fujimura

(10) Patent No.: US 9,954,017 B2
(45) Date of Patent: Apr. 24, 2018

(54) RADIATION IMAGE-PICKUP DEVICE AND RADIATION IMAGE-PICKUP DISPLAY SYSTEM

(71) Applicant: Sony Corporation, Tokyo (JP)

(72) Inventor: Takashi Fujimura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 538 days.

(21) Appl. No.: 14/294,229

(22) Filed: Jun. 3, 2014

(65) Prior Publication Data

US 2014/0361180 A1    Dec. 11, 2014

(30) Foreign Application Priority Data

Jun. 11, 2013  (JP) ................ 2013-122642

(51) Int. Cl.
  *G01T 1/20*   (2006.01)
  *H01L 27/146* (2006.01)

(52) U.S. Cl.
  CPC .. *H01L 27/14612* (2013.01); *H01L 27/14623* (2013.01); *H01L 27/14661* (2013.01); *H01L 27/14659* (2013.01); *H01L 27/14663* (2013.01)

(58) Field of Classification Search
  CPC ............... G01T 1/2002; G01T 1/2985
  See application file for complete search history.

(56) References Cited

U.S. PATENT DOCUMENTS

| | | | | |
|---|---|---|---|---|
| 5,956,382 A | * | 9/1999 | Wiener-Avnear | B23K 26/00 250/367 |
| 6,298,113 B1 | * | 10/2001 | Duclos | G01T 1/2002 250/367 |
| 7,388,208 B2 | * | 6/2008 | Deych | G01T 1/2018 250/367 |
| 2002/0190214 A1 | * | 12/2002 | Wieczorek | G01T 1/202 250/367 |
| 2009/0302202 A1 | * | 12/2009 | Sato | H01L 27/14603 250/208.1 |

FOREIGN PATENT DOCUMENTS

JP    2002-228757    8/2002

* cited by examiner

*Primary Examiner* — Kenneth J Malkowski
(74) *Attorney, Agent, or Firm* — Dentons US LLP

(57) ABSTRACT

A radiation image-pickup device includes: a plurality of pixels configured to generate signal charge based on radiation; a first substrate including a transistor configured to read out the signal charge; a second substrate disposed to face the first substrate; a conversion layer provided between the first substrate and the second substrate, the conversion layer being provided for each of the pixels, and being configured to convert the radiation to other wavelength or an electric signal; a partition provided between the first substrate and the second substrate, to partition the conversion layer for each of the pixels; and a radiation shielding layer provided to face the partition.

16 Claims, 23 Drawing Sheets

RADIATION IMAGE-PICKUP DEVICE AND RADIATION IMAGE-PICKUP DISPLAY SYSTEM

CROSS REFERENCE TO RELATED APPLICATIONS

This application claims the benefit of Japanese Priority Patent Application JP2013-122642 filed Jun. 11, 2013, the entire contents of which are incorporated herein by reference.

BACKGROUND

The present disclosure relates to a radiation image-pickup device obtaining an image based on radiation that has entered, and a radiation image-pickup display system including such a radiation image-pickup device.

In recent years, radiation image-pickup devices that obtain an image based on radiation such as X-rays as an electric signal have been developed (for example, Japanese Unexamined Patent Application Publication No. 2002-228757). Such radiation image-pickup devices are broadly divided into, so-called, an indirect conversion type and a direct conversion type. In a radiation image-pickup device of the indirect conversion type, for example, an X-ray conversion substrate and a sensor substrate may be adhered to each other. The X-ray conversion substrate includes a conversion layer converting X-rays to visible light, and the sensor substrate includes a photoelectric conversion element generating an electric signal based on visible light.

SUMMARY

In a radiation image-pickup device like those described above, a thin film transistor (TFT) is provided on a sensor substrate, as a switching element used to read out signal charge. When properties of this TFT deteriorate, reliability decreases, which is disadvantageous.

It is desirable to provide a radiation image-pickup device capable of achieving high reliability by suppressing deterioration of properties of a transistor, and to provide a radiation image-pickup display system including such a radiation image-pickup device.

According to an embodiment of the present disclosure, there is provided a radiation image-pickup device including: a plurality of pixels configured to generate signal charge based on radiation; a first substrate including a transistor configured to read out the signal charge; a second substrate disposed to face the first substrate; a conversion layer provided between the first substrate and the second substrate, the conversion layer being provided for each of the pixels, and being configured to convert the radiation to other wavelength or an electric signal; a partition provided between the first substrate and the second substrate, to partition the conversion layer for each of the pixels; and a radiation shielding layer provided to face the partition.

According to an embodiment of the present disclosure, there is provided a radiation image-pickup display system including: a radiation image-pickup device; and a display configured to perform image display based on an image pickup signal obtained by the radiation image-pickup device, wherein the radiation image-pickup device includes, a plurality of pixels configured to generate signal charge based on radiation, a first substrate including a transistor configured to read out the signal charge, a second substrate disposed to face the first substrate, a conversion layer provided between the first substrate and the second substrate, the conversion layer being provided for each of the pixels, and being configured to convert the radiation to other wavelength or an electric signal, a partition provided between the first substrate and the second substrate, to partition the conversion layer for each of the pixels, and a radiation shielding layer provided to face the partition.

In the radiation image-pickup device and the radiation image-pickup display system according to the above-described embodiments of the present disclosure, the predetermined conversion layer and the predetermined partition are provided between the first substrate and the second substrate, the first substrate including the transistor. Here, a wiring such as a signal line may be provided in a region of the first substrate, the region facing the partition, and the transistor may be provided to be adjacent to this wiring. Even if the partition allows the radiation to pass therethrough, the radiation is prevented from easily arriving at the transistor provided in the first substrate, because the radiation shielding layer is provided to face the partition.

According to the radiation image-pickup device and the radiation image-pickup display system of the above-described embodiments of the present disclosure, the predetermined conversion layer and the predetermined partition are provided between the first substrate and the second substrate, the first substrate including the transistor. Therefore, it is possible to suppress entrance of the radiation into the transistor. This reduces damage to the transistor due to the radiation, thereby allowing suppression of deterioration of properties. Accordingly, high reliability is achievable by suppressing deterioration of the properties of the transistor.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

Some embodiments will be described below with reference to the drawings. It is to be noted the description will be provided in the following order.
1. First embodiment (an example of a radiation image-pickup device in which a shielding layer is provided on a radiation entering side of a supporting substrate)
2. Modification 1-1 (an example in which a shielding layer is provided between a supporting substrate and a partition).
3. Modification 1-2 (an example in which a shielding layer is provided between a sensor substrate and a partition)
4. Second embodiment (an example of a radiation image-pickup device in which an uneven shape is formed on a radiation-entering-side surface of a supporting substrate, and a projection section thereof is provided to serve as a shielding layer)
5. Modification 2-1 (an example in which an uneven shape is formed on a partition-side surface of a supporting substrate)
6. Modification 2-2 (an example when a projection section of an uneven shape of a supporting substrate also serves as a partition)
7. Modification 3 (an example of another passive pixel circuit)
8. Modification 4 (an example of still another passive pixel circuit)
9. Modifications 5-1 and 5-2 (examples of an active pixel circuit)
10. Modification 6 (an example of a direct-conversion-type pixel section)
11. Application example (an example of a radiation image-pickup display system)

First Embodiment

Configuration

Figure 1:
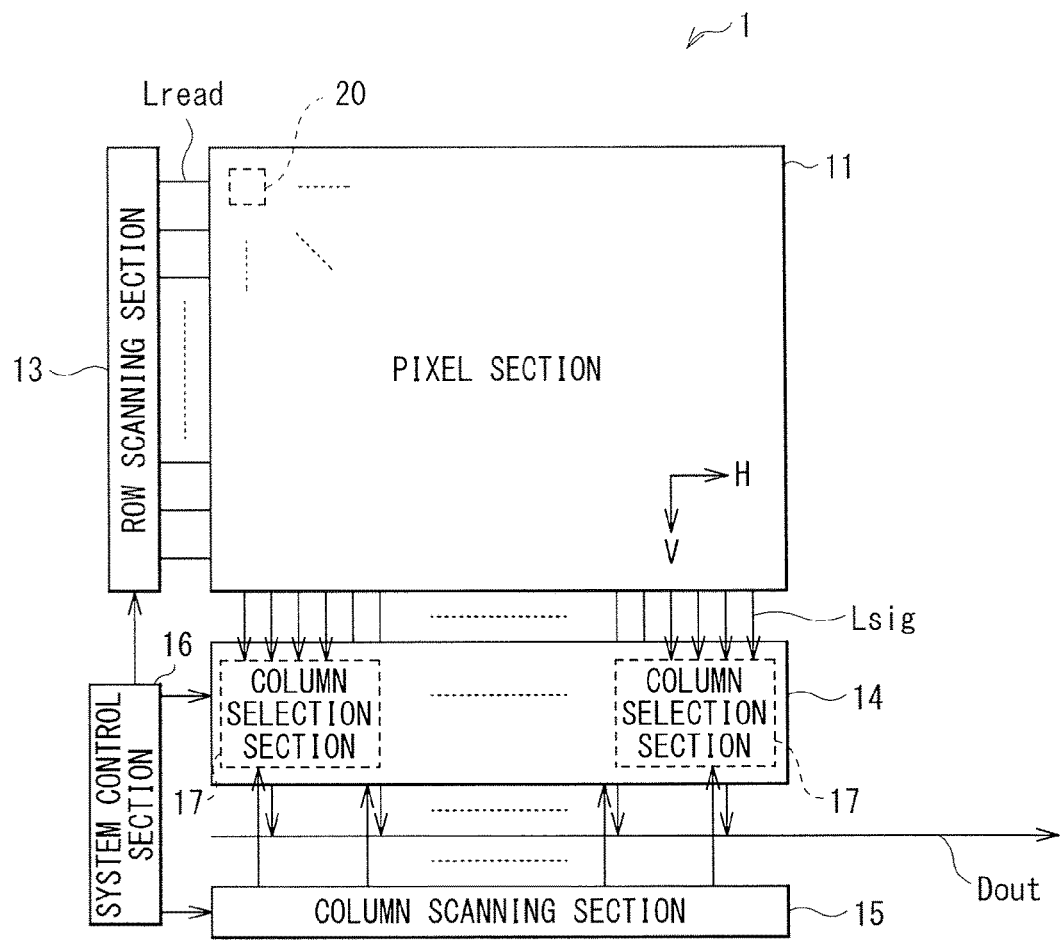
FIG. 1 is a block diagram illustrating an overall configuration example of a radiation image-pickup device according to a first embodiment of the present disclosure.

FIG. 1 illustrates an overall block configuration of a radiation image-pickup device (a radiation image-pickup device 1) according to a first embodiment of the present disclosure. The radiation image-pickup device 1 reads information of a subject (picks up an image of a subject) based on entering radiation (for example, X-rays). The radiation image-pickup device 1 includes a pixel section 11. The radiation image-pickup device 1 further includes, as drive circuits of the pixel section 11, a row scanning section 13, an A/D conversion section 14, a column scanning section 15, and a system control section 16.
(Pixel Section 11)

The pixel section 11 includes a plurality of pixels (image pickup pixels, or unit pixels) 20 generating signal charge based radiation. The pixels 20 are two-dimensionally arranged in rows and columns (in a matrix). It is to be noted that, in the following, a horizontal direction (a row direction) in the pixel section 11 will be referred to as an "H" direction, and a vertical direction (a column direction) will be referred to as a "V" direction, as illustrated in FIG. 1. It is to be noted that, although a radiation image-pickup device according to an embodiment of the present disclosure is applicable to both of an indirect conversion type and a direct conversion type, a case of the indirect conversion type will be taken as an example in the following description. Specifically, as will be described in more detail later, in the pixel section 11, radiation is converted to visible light in a conversion layer (a wavelength conversion layer 24), this visible light is converted to an electric signal in a photoelectric conversion element 21, and the electric signal is read out as signal charge.

Figure 2:
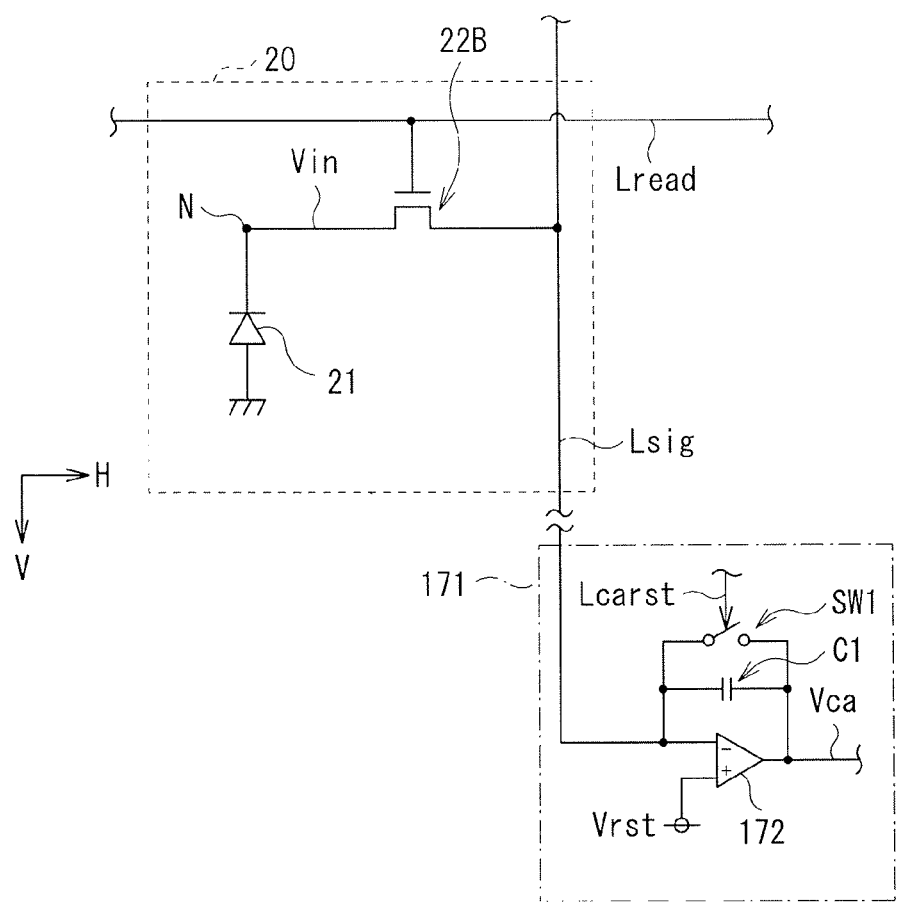
FIG. 2 is a circuit diagram illustrating a detailed configuration example of components including a pixel illustrated in FIG. 1.

FIG. 2 illustrates an example of a circuit configuration (a so-called passive circuit configuration) of the pixel 20, together with a circuit configuration of a charge amplifier circuit 171 to be described later provided in the A/D conversion section 14. This passive pixel 20 may include, for example, the one photoelectric conversion element 21 and one TFT 22B. Further, a readout control line Lread (a scanning line, or a gate line) extending in the H direction and a signal line Lsig extending in the V direction are connected to the pixel 20.

The photoelectric conversion element 21 may be configured using, for example, a positive-intrinsic-negative (PIN) photodiode or a metal-insulator-semiconductor (MIS) sensor, and generates signal charge of a charge amount corresponding to an entering light quantity, as described above. It is to be noted that, here, a cathode of the photoelectric conversion element 21 is connected to a storage node N.

The TFT 22B is a transistor (a readout transistor) that outputs the signal charge (an input voltage Vin) obtained by the photoelectric conversion element 21 to the signal line Lsig, by changing to an ON state in response to a row scanning signal supplied through the readout control line Lread. The TFT 22B may be configured using, for example, an N-channel-type (N-type) field effect transistor (FET). However, the TFT 22B may be configured using other type such as a P-channel-type (P-type) FET.

The TFT 22B may have, for example, a bottom-gate-type or a top-gate-type element structure. Alternatively, the TFT 22B may have a so-called dual-gate-type (both-side-type) element structure in which two gate electrodes are disposed to face each other with a semiconductor layer (an active layer) interposed therebetween. The semiconductor layer of the TFT 22B may be configured using, for example, a silicon system semiconductor such as amorphous silicon, microcrystal silicon, and poly-silicon, and preferably, low temperature poly-silicon (LTPS) may be used. Alternatively, the semiconductor layer of the TFT 22B may be configured using an oxide semiconductor such as zinc oxide (ZnO) and indium gallium zinc oxide (InGaZnO). However, in the present embodiment, as will be described later, it is possible to suppress entrance of radiation into the TFT 22B and therefore, in particular, the low temperature poly-silicon that is easily damaged by X-rays may be used effectively.

Figure 3:
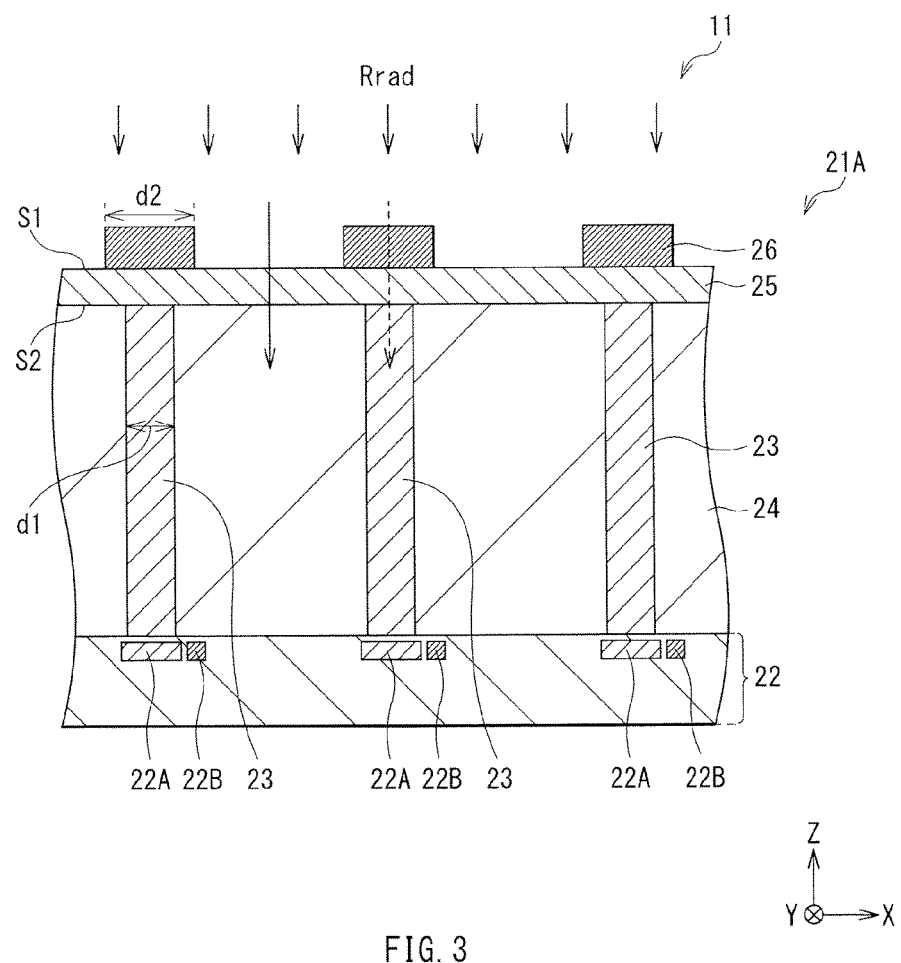
FIG. 3 is a cross-sectional diagram illustrating a configuration of a pixel section illustrated in FIG. 1.
Figure 4:
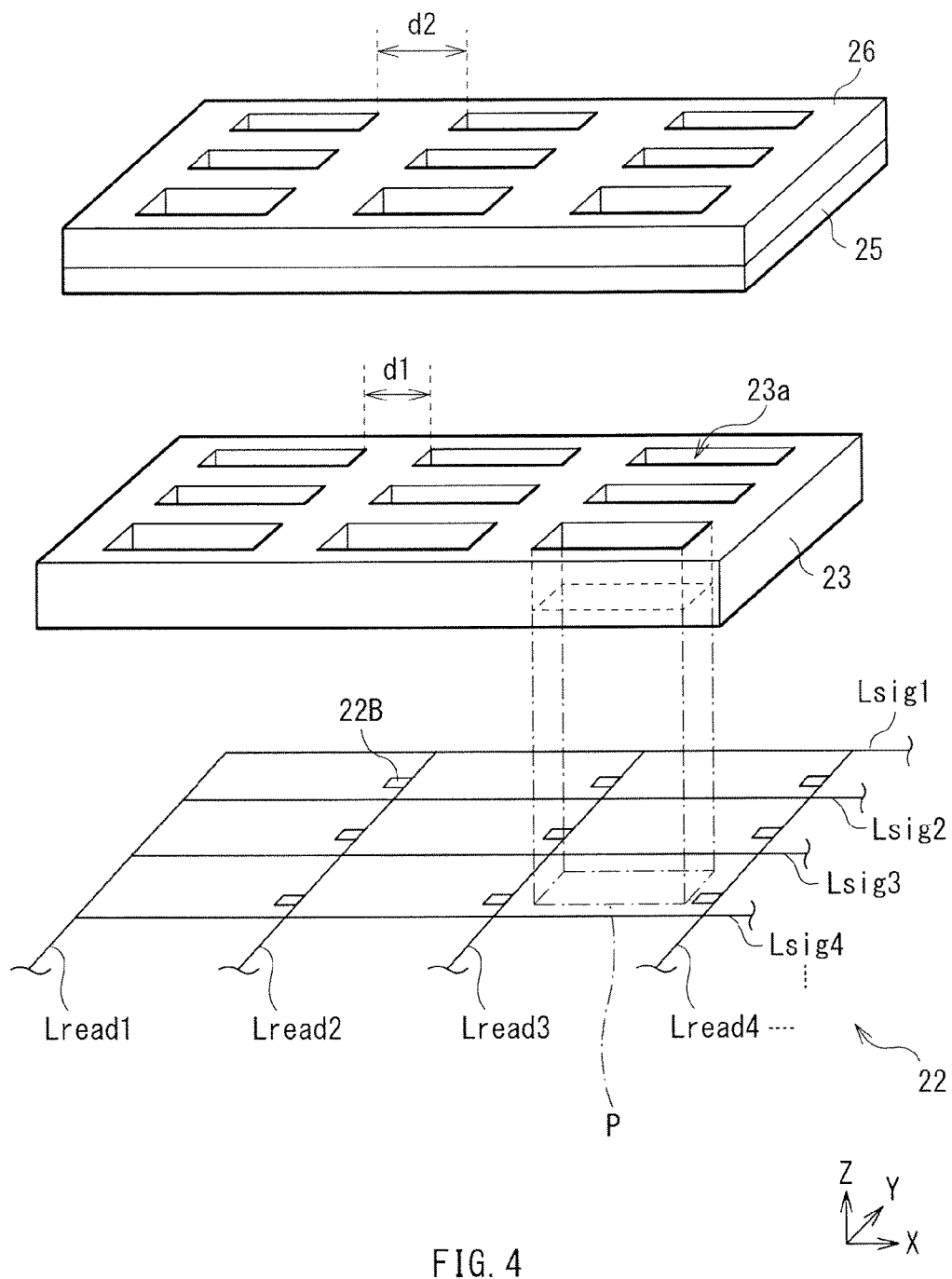
FIG. 4 is a perspective view illustrating a main part configuration of the pixel section illustrated in FIG. 3.

FIG. 3 illustrates a cross-sectional configuration of the pixel section 11 including the above-described pixels 20. FIG. 4 is an exploded view of a main part configuration of the pixel section 11. In the pixel section 11, the wavelength conversion layer 24 is provided between a sensor substrate 22 (a first substrate) and a supporting substrate 25 (a second substrate) disposed to face each other. Between the sensor substrate 22 and the supporting substrate 25, the wavelength conversion layer 24 is partitioned for each of the pixels 20 by a partition 23. In the pixel section 11, a radiation conversion substrate 21A and the sensor substrate 22 are adhered to each other. The radiation conversion substrate 21A includes the wavelength conversion layer 24, the partition 23, the supporting substrate 25, and a shielding layer 26.

In the sensor substrate 22, the above-described photoelectric conversion element 21 (not illustrated in FIG. 3), as well as a wiring 22A, the TFT 22B, and the like are formed on a substrate made of a material such as glass. The wiring 22A may correspond to, for example, the readout control line Lread or the signal line Lsig described earlier. The wirings 22A are formed to intersect each other in an X direction and a Y direction, in an XY plane of the sensor substrate 22. The TFT 22B is formed to be adjacent to the wiring 22A, for the purpose of reducing noise and suppressing fill factor reduction. It is to be noted that, in FIG. 4, only four of the readout control lines Lread (Lread1 to Lread4) and four of the signal lines Lsig (Lsig1 to Lsig4) in the sensor substrate 22 are illustrated for convenience, and a configuration of a part of each of the partition 23 and the shielding layer 26 corresponding thereto is illustrated.

The partition 23 is formed in a region between the pixels 20, to partition the wavelength conversion layer 24 for each of the pixels. In other words, each part (an opening 23a) surrounded by a grid of the partition 23 is filled with the wavelength conversion layer 24. The partition 23 is provided to face the wiring 22A of the sensor substrate 22 in order to suppress the reduction of the fill factor, and a planar shape of the partition 23 is a grid shape. This is to suppress the reduction of the fill factor of the sensor. The partition 23 described above may be configured using, for example, photosensitive glass (for example, a mixture of ceramic powder and low-melting glass), and may have, for example, a thickness (a height) of about 0.15 mm to 0.5 mm. Further, a width d1 of the partition 23 may be, for example, 0.02 mm to 0.1 mm.

The wavelength conversion layer 24 converts radiation Rrad (such as alpha rays, beta rays, gamma rays, and X-rays) to rays of a wavelength in a sensitivity range of the photoelectric conversion element 21, and may be configured using, for example, a phosphor (for example, a scintillator) that converts X-rays to visible light. Examples of a phosphor material may include CsI (Tl-added), $Gd_2O_2S$, BaFX (X is Cl, Br, I, or the like), NaI, and $CaF_2$. The wavelength conversion layer 24 has a thickness equal to the thickness (the height) of the partition 23.

The supporting substrate 25 may be made of, for example, a material such as glass, ceramic, a semiconductor, metal, and a polymer material. Examples of the material of the supporting substrate 25 may include: flat glass such as quartz, borosilicate glass, and chemically tempered glass; sapphire; ceramic such as silicon nitride and silicon carbide; semiconductors such as silicon, germanium, gallium arsenide, gallium phosphide, and gallium nitride; and metal such as aluminum (Al), iron (Fe), and copper (Cu), as well as these metallic elements each covered with a metal oxide. The examples of the material of the supporting substrate 25 may include polymer materials (plastic) such as polyester, polyethylene terephthalate, polyamide, polyimide, and carbon-fiber-reinforced resin. In this way, the material of the supporting substrate 25 is not limited in particular, but may be preferably a material having a high elastic modulus and a stable count, like flat glass. The supporting substrate 25 may have a thickness of, for example, 0.5 mm to 2.0 mm.

In the present embodiment, the shielding layer 26 is formed on one surface side (here, an entering side of the radiation Rrad, or a surface S1 opposite to the partition 23) of the supporting substrate 25.

Figure 5A:
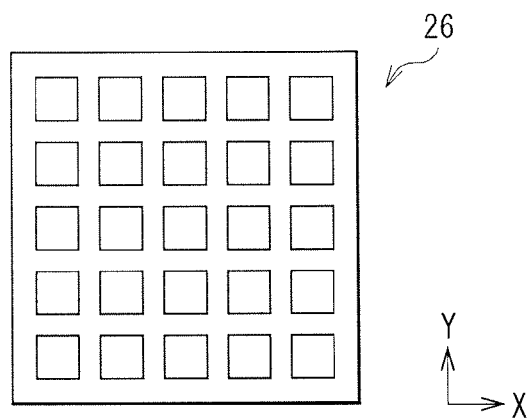
FIG. 5A is an XY plan view illustrating a configuration example of a shielding layer illustrated in FIG. 3.
Figure 5B:
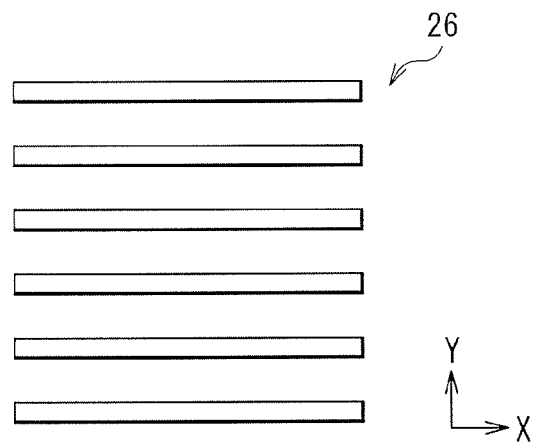
FIG. 5B is an XY plan view illustrating another configuration example of the shielding layer illustrated in FIG. 3.
Figure 5C:
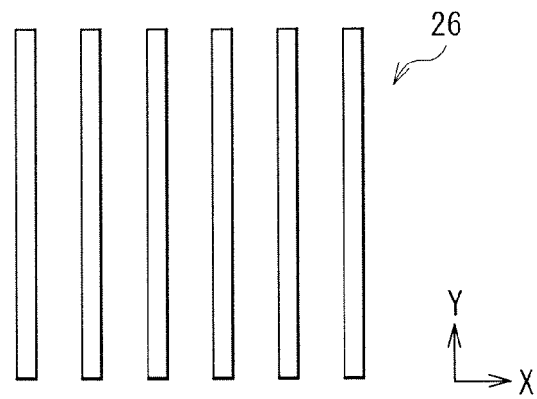
FIG. 5C is an XY plan view illustrating still another configuration example of the shielding layer illustrated in FIG. 3.

The shielding layer 26 may be configured using a material shielding (absorbing or reflecting) the radiation Rrad, for example, metal or the like having X-ray shielding effects, such as tungsten (W). The shielding layer 26 is provided on the supporting substrate 25, to face the partition 23 (the wiring 22A of the sensor substrate 22). Specifically, as illustrated in FIGS. 4 and 5A, a planar shape of the shielding layer 26 may be, for example, a grid shape substantially equivalent to the partition 23. In other words, the shielding layer 26 is formed along (to face) both of the readout control line Lread and the signal line Lsig of the sensor substrate 22. However, as illustrated in FIG. 5B, the shielding layer 26 may be in a stripe shape extending in the X direction. In this case, the shielding layer 26 is formed along the signal line Lsig of the sensor substrate 22. Alternatively, as illustrated in FIG. 5C, the shielding layer 26 may be in a stripe shape extending in the Y direction. In this case, the shielding layer 26 is formed along the readout control line Lread of the sensor substrate 22. In either case, the shielding layer 26 may be preferably formed along the wiring 22A to which the TFT 22B is adjacent. In the following, the description will be provided by taking, as an example, the case in which the shielding layer 26 is in the grid shape.

To reduce the quantity of the radiation Rrad entering the TFT 22B, a width d2 of the shielding layer 26 is made equal to or larger than the width d1 of the partition 23, and may be preferably larger than the width d1. The width d2 may be, for example, 0.03 mm to 0.12 mm.

(Row Scanning Section 13)

The row scanning section 13 includes a shift register circuit to be described later, a predetermined logical circuit, etc. The row scanning section 13 is a pixel driving section (a row scanning circuit) that performs driving (line-sequential scanning) of the plurality of pixels 20 of the pixel section 11 row by row (by a horizontal line unit). Specifically, the row scanning section 13 may perform image pickup operation such as reading operation and reset operation of each of the pixels 20 by, for example, line-sequential scanning. It is to be noted that, this line-sequential scanning is performed by supplying the above-described row scanning signal to each of the pixels 20 through the readout control line Lread.

(A/D Conversion Section 14)

The A/D conversion section 14 includes a plurality of column selection sections 17 each provided for a plurality of the (here, four) signal lines Lsig. The A/D conversion section 14 performs A/D conversion (analog-to-digital conversion) based on a signal voltage (a voltage corresponding to the signal charge) inputted through the signal line Lsig. As a result, output data Dout (an image pickup signal) that is a digital signal is generated and outputted to outside.

Figure 6:
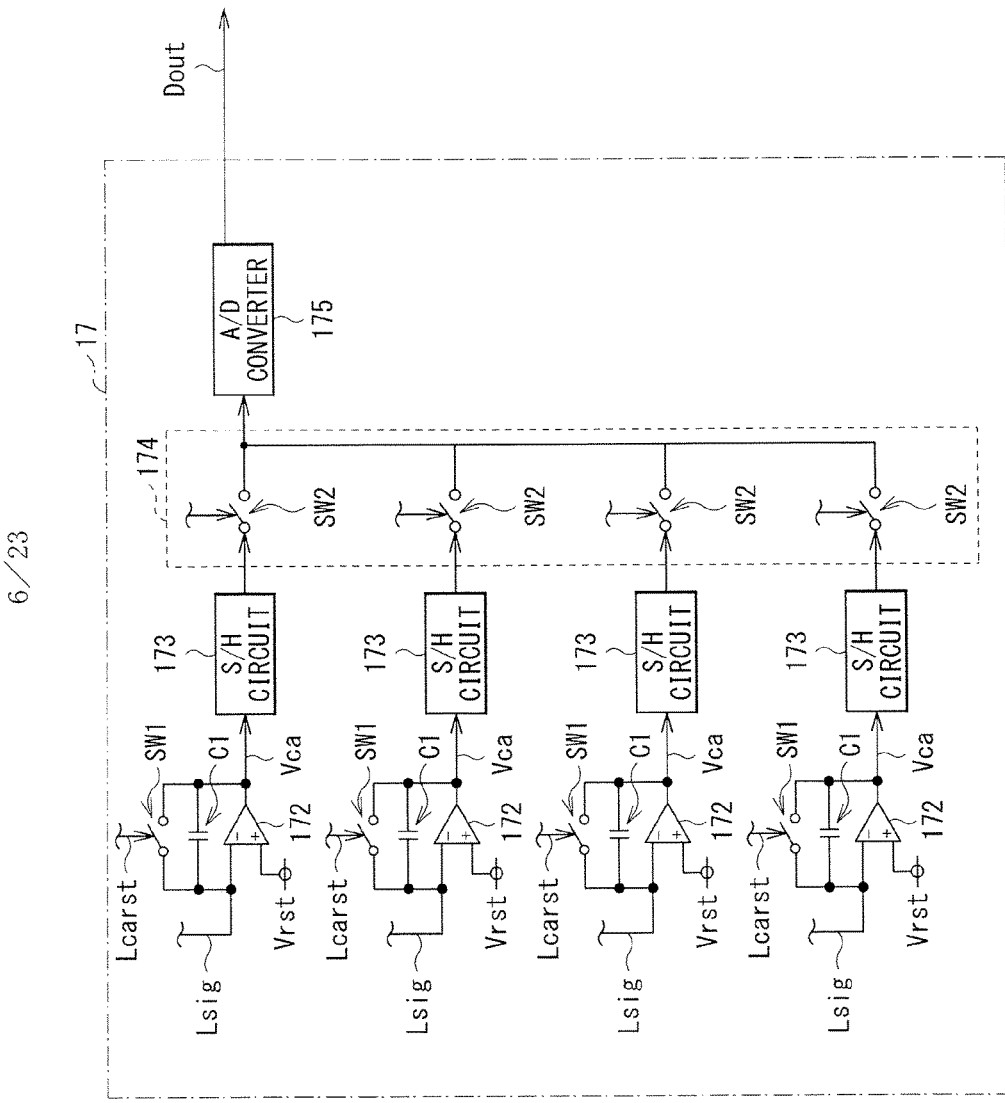
FIG. 6 is a block diagram illustrating a detailed configuration example of a column selection section illustrated in FIG. 1.

For example, as illustrated in FIG. 6, each of the column selection sections 17 may include a charge amplifier 172, a capacitive element (a capacitor, a feedback capacitor, or the like) C1, a switch SW1, a sample hold (S/H) circuit 173, a multiplexor circuit (a selection circuit) 174 including four switches SW2, and an A/D converter 175. Of these components, the charge amplifier 172, the capacitive element C1, the switch SW1, the S/H circuit 173, and the switch SW2 correspond to the charge amplifier circuit 171 illustrated in FIG. 2, and are provided for each of the signal lines Lsig. The multiplexor circuit 174 and the A/D converter 175 are provided for each of the column selection sections 17.

The charge amplifier 172 is an amplifier provided to perform conversion (Q-V conversion) in which the signal charge read out from the signal line Lsig is converted to a voltage. In the charge amplifier 172, one end of the signal line Lsig is connected to an input terminal on a negative side (− side), and a predetermined reset voltage Vrst is inputted to an input terminal on a positive side (+ side). Between an output terminal and the input terminal on the negative side of the charge amplifier 172, feedback connection is established through a parallel connection circuit including the capacitive element C1 and the switch SW1. In other words, one terminal of the capacitive element C1 is connected to the input terminal on the negative side of the charge amplifier 172, and the other terminal is connected to the output terminal of the charge amplifier 172. Similarly, one terminal of the switch SW1 is connected to the input terminal on the negative side of the charge amplifier 172, and the other terminal is connected to the output terminal of the charge amplifier 172. It is to be noted that an ON/OFF state of the switch SW1 is controlled by a control signal (an amplifier reset control signal) supplied from the system control section 16 through an amplifier reset control line Lcarst.

The S/H circuit 173 is disposed between the charge amplifier 172 and the multiplexor circuit 174 (the switch SW2), and is a circuit provided to hold an output voltage Vca from the charge amplifier 172 temporarily.

The multiplexor circuit 174 is a circuit that selectively makes or breaks connection between each of the S/H circuits 173 and the A/D converter 175, when one of the four switches SW2 is sequentially brought to the ON state according to scanning driving by the column scanning section 15.

The A/D converter 175 is a circuit that performs A/D conversion of the output voltage inputted from the S/H circuit 173 through the switch SW2, thereby generating the above-described output data Dout and outputs the generated output data Dout.

(Column Scanning Section 15)

The column scanning section 15 may include, for example, a shift register, an address decoder, etc. not illustrated, and sequentially drives each of the switches SW2 in the column selection section 17 while scanning each of the switches SW2. By such selective scanning performed by the column scanning section 15, the signal (the above-described output data Dout) of each of the pixels 20 read out through each of the signal lines Lsig is sequentially outputted to the outside.

(System Control Section 16)

The system control section 16 controls each operation of the row scanning section 13, the A/D conversion section 14, and the column scanning section 15. Specifically, the system control section 16 includes a timing generator that generates the above-described various timing signals (control signals). Based on these various timing signals generated by the timing generator, the system control section 16 performs control of driving the row scanning section 13, the A/D conversion section 14, and the column scanning section 15. Based on this control of the system control section 16, each of the row scanning section 13, the A/D conversion section 14, and the column scanning section 15 performs image-pickup driving (line-sequential image-pickup driving) for the plurality of pixels 20 in the pixel section 11, so that the output data Dout is obtained from the pixel section 11.

Method of Manufacturing

The above-described pixel section 11 of the radiation image-pickup device 1 may be manufactured as follows, for example. FIGS. 7A to 9 are schematic diagrams used to describe a method of manufacturing the pixel section 11.

Figure 7A:
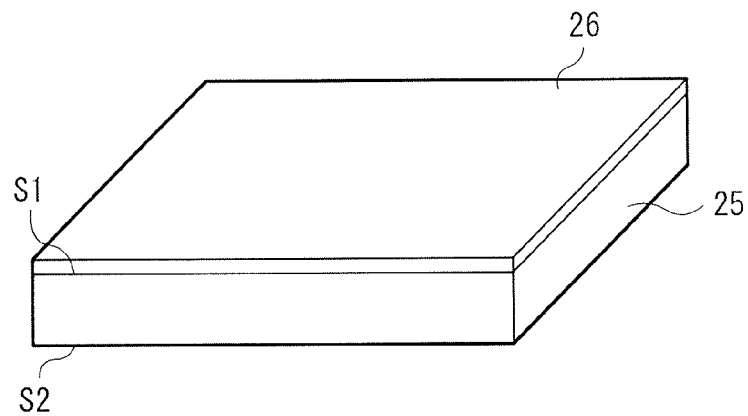
FIG. 7A is a perspective view used to describe a method of manufacturing the pixel section illustrated in FIG. 3.
Figure 7B:
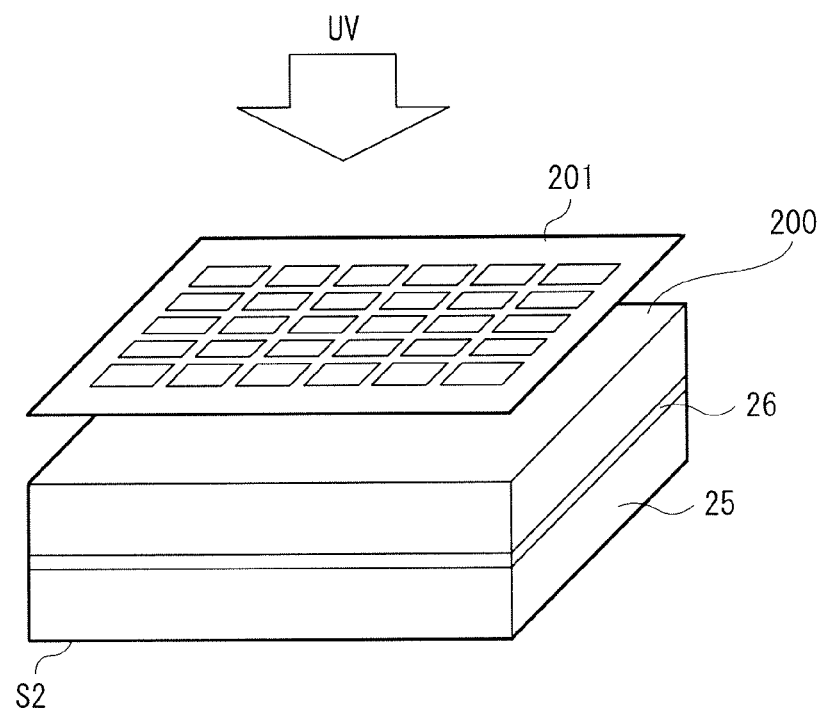
FIG. 7B is a perspective view illustrating a process following a process in FIG. 7A.
Figure 7C:
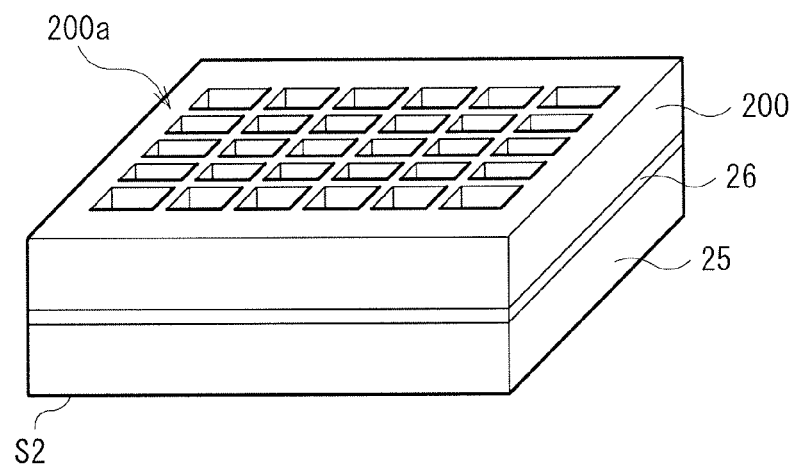
FIG. 7C is a perspective view illustrating a process following the process in FIG. 7B.
Figure 7D:
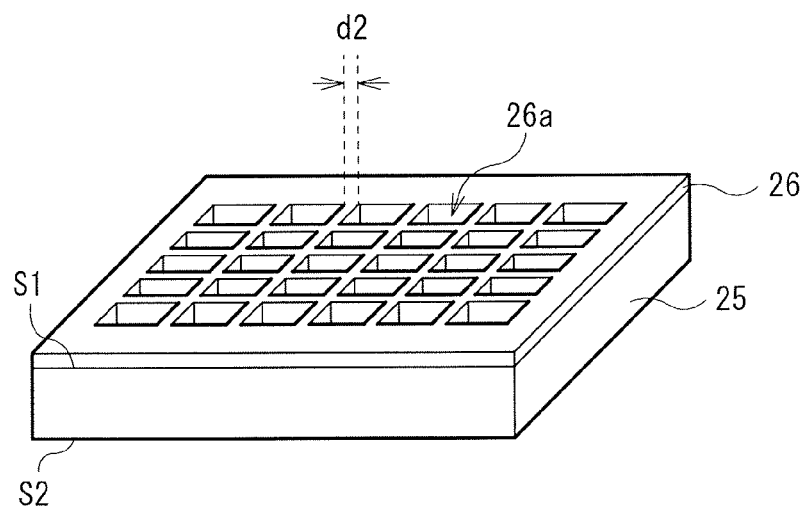
FIG. 7D is a perspective view illustrating a process following the process in FIG. 7C.

First, on the surface S1 of the supporting substrate 25 made of the above-described material (for example, glass) and having the above-described thickness, the shielding layer 26 made of the above-described radiation shielding material (for example, tungsten) is formed. Specifically, at first, as illustrated in FIG. 7A, the shielding layer 26 may be formed on the surface S1 of the supporting substrate 25 by sputtering, for example. Next, as illustrated in FIG. 7B, on the shielding layer 26, a photoresist 200 made of a dry film resist (DFR) may be attached and then, ultraviolet (UV) exposure may be performed using, for example, a photomask 201. Subsequently, as illustrated in FIG. 7C, processing such as development processing is performed so that a pattern 200a, in which the DFR except a region facing the partition 23 is selectively removed, is formed on the photoresist 200. The shielding layer 26 may be then patterned by, for example, wet etching, to form an opening 26a for each of the pixels 20 (the shielding layer 26 in the grid shape is formed). Afterwards, as illustrated in FIG. 7D, the photoresist 200 is peeled off. In this way, the shielding layer 26 in the grid shape is formed on the surface S1 of the supporting substrate 25.

Figure 8A:
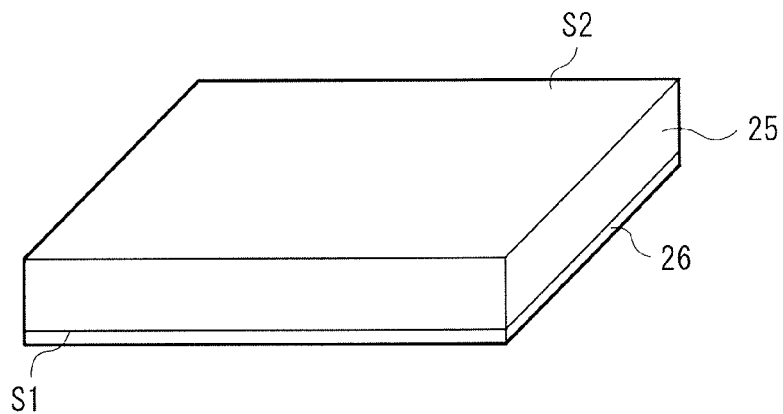
FIG. 8A is a perspective view illustrating a process following the process in FIG. 7D.
Figure 8B:
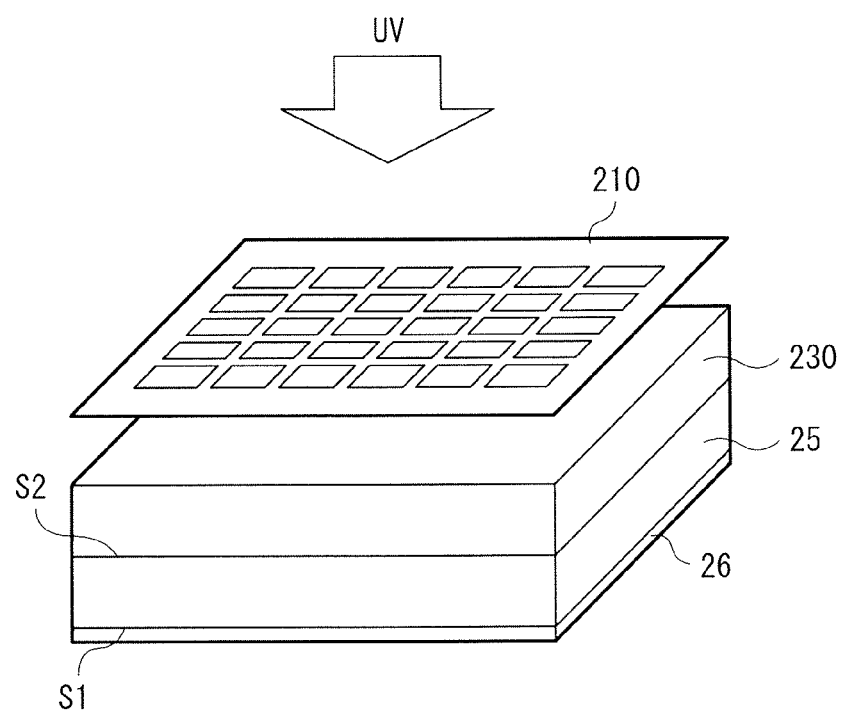
FIG. 8B is a perspective view illustrating a process following the process in FIG. 8A.
Figure 8C:
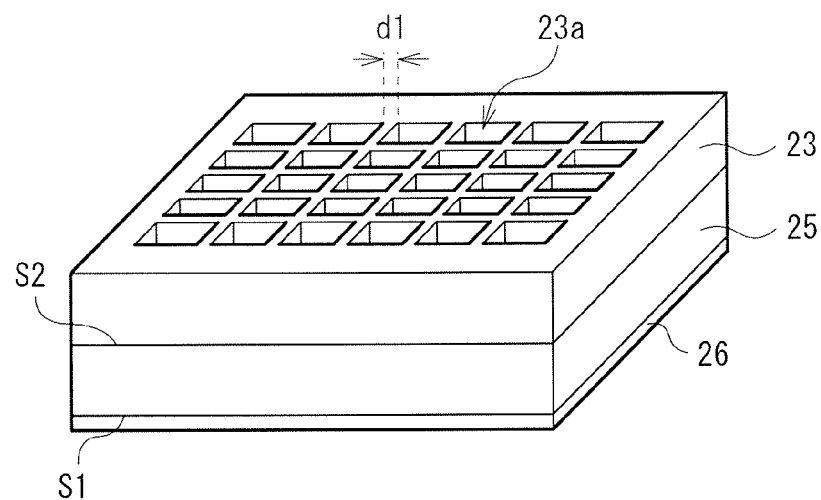
FIG. 8C is a perspective view illustrating a process following the process in FIG. 8B.

Next, as illustrated in FIG. 8A, on a surface S2 of the supporting substrate 25 where the shielding layer 26 is formed, the partition 23 and the wavelength conversion layer 24 are formed. Specifically, first, as illustrated in FIG. 8B, photosensitive glass 230 including inorganic fine particles of the ceramic as described above may be applied onto the surface S2 of the supporting substrate 25 by screen printing, for example, and then dried. Next, UV exposure is performed using a photomask 210 in which openings are formed to correspond to a pixel pattern. Subsequently, as illustrated in FIG. 8C, the opening 23a is formed for each of the pixels 20, by patterning the photosensitive glass 230 by performing development processing, firing processing, and the like. In this way, the partition 23 in the grid shape is formed on the surface S2 of the supporting substrate 25.

It is to be noted that, when the width d2 of the shielding layer 26 and the width d1 of the partition 23 are designed to be equal, the photosensitive glass 230 may be patterned by performing UV exposure from the surface S1 side of the supporting substrate 25 (back-surface exposure), by using the shielding layer 26 as a mask. In this case, misalignment between the shielding layer 26 and the partition 23 does not easily occur.

In addition, examples of a formation technique (a patterning technique) of the partition 23 may include various techniques, in addition to the technique described above. For example, a glass paste may be applied onto the surface S2 of the supporting substrate 25, as the material of the partition 23, and then patterned to be in a grid shape by laser beam processing. Moreover, it is also possible to perform processing by a technique such as sandblast, micromachining, and dicing.

Figure 9:
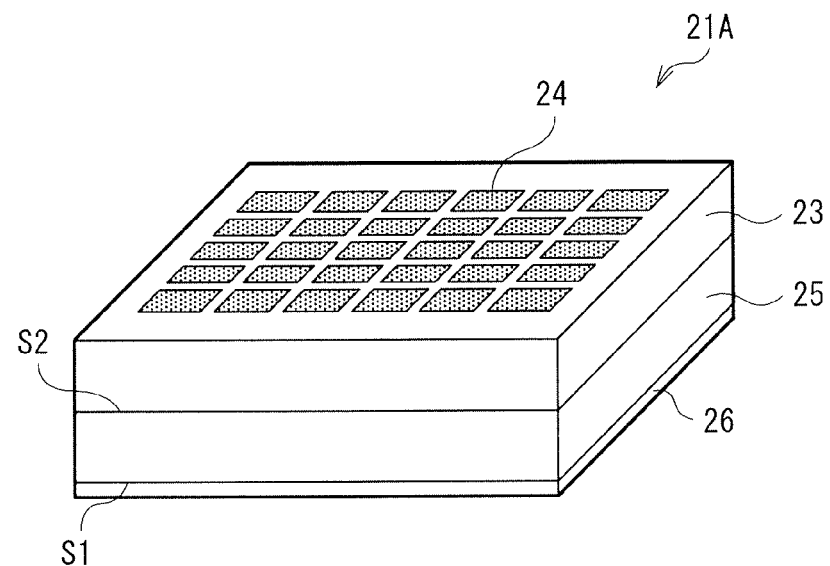
FIG. 9 is a perspective view illustrating a process following the process in FIG. 8C.

Next, as illustrated in FIG. 9, the wavelength conversion layer 24 is formed by embedding the above-described phosphor material in each of the openings 23a of the partition 23. It is possible to form the radiation conversion substrate 21A in this way. Subsequently, although illustration is omitted, it is possible to manufacture the pixel section 11 illustrated in FIG. 3, by adhering the sensor substrate 22 and the radiation conversion substrate 21A to each other.

It is to be noted that, although the wavelength conversion layer 24 is formed by being embedded after the formation of the partition 23, this formation order may be reversed. For example, first, on the entire surface S2 of the supporting substrate 25, a phosphor material may be deposited and then, grooves may be formed (notches may be formed) in a grid shape by using dicing or the like. Next, the radiation conversion substrate 21A may be formed by filling the grooves of the grid shape, with the material of the partition 23.

Functions and Effects

In the radiation image-pickup device 1 of the present embodiment, when, for example, the radiation Rrad such as X-rays enters the pixel section 11, the radiation may be converted to visible light in the radiation conversion substrate 21A, and this visible light is received by each of the pixels 20 (each of the photoelectric conversion elements 21) in the sensor substrate 22. As a result, in each of the pixels 20 (the photoelectric conversion elements 21), signal charge based on the entering light is generated (photoelectric conversion is performed). At this moment, in the storage node N (FIG. 2), a voltage variation corresponding to a node capacity occurs due to storage of the generated signal charge. In response to such a voltage variation, the input voltage Vin (the voltage corresponding to the signal charge) is supplied to a drain of the TFT 22B. Subsequently, when the TFT 22B changes to the ON state in response to the row scanning signal supplied through the readout control line Lread, the above-described signal charge is read out to the signal line Lsig.

The signal charge thus read out is inputted to the column selection section 17 in the A/D conversion section 14, for each plurality of (here, four) pixel columns, through the signal line Lsig. In the column selection section 17, at first, the Q-V conversion (conversion from signal charge to a signal voltage) is performed in the charge amplifier circuit including the charge amplifier 172 and the like, for each signal charge inputted through each of the signal lines Lsig. Next, for each of the signal voltages after the Q-V conversion (an output voltage Vca from the charge amplifier 172), the A/D conversion is performed in the A/D converter 175 through the S/H circuit 173 and the multiplexor circuit 174. Then, the output data Dout (the image pickup signal) that is a digital signal is generated. In this way, the output data Dout is sequentially outputted from each of the column selection sections 17, and then transmitted to the outside (or inputted to an internal memory not illustrated).

Here, in the pixel section 11, a part of the radiation Rrad (X-rays) that has entered leaks into the sensor substrate 22, without being subjected to wavelength conversion in the wavelength conversion layer 24, i.e., by passing through the partition 23. As described above, for the purpose of reducing noise and suppressing fill factor reduction, the TFT 22B is provided to be adjacent to the wiring 22A, in a region facing the partition 23 of the sensor substrate 22 or in a region in proximity thereto. For this reason, the TFT 22B may be easily damaged by the radiation that has passed through the partition 23. As a result, a shift or the like of the threshold voltage occurs, which impairs properties of the TFT 22B.

Therefore, in the present embodiment, the shielding layer 26 is disposed on the surface S1 of the supporting substrate 25, to face the partition 23. This makes the arrival of the radiation at the TFT 22B through the partition 23 difficult, thereby reducing the above-described damage caused by the influence of the radiation, which allows suppression of deterioration of the properties.

As described above, in the present embodiment, on the surface S1 of the supporting substrate 25 disposed to face the sensor substrate 22, the shielding layer 26 is provided to face the partition 23. Therefore, it is possible to suppress entrance of the radiation into the TFT 22B. Hence, it is possible to achieve high reliability, by suppressing deterioration of the properties of the transistor.

Next, modifications of the above-described first embodiment and other embodiment will be described. It is to be noted that the same components as those of the above-described first embodiment will be provided with the same reference numerals as those thereof, and the description of these components will be omitted as appropriate.

Modification 1-1

Figure 10:
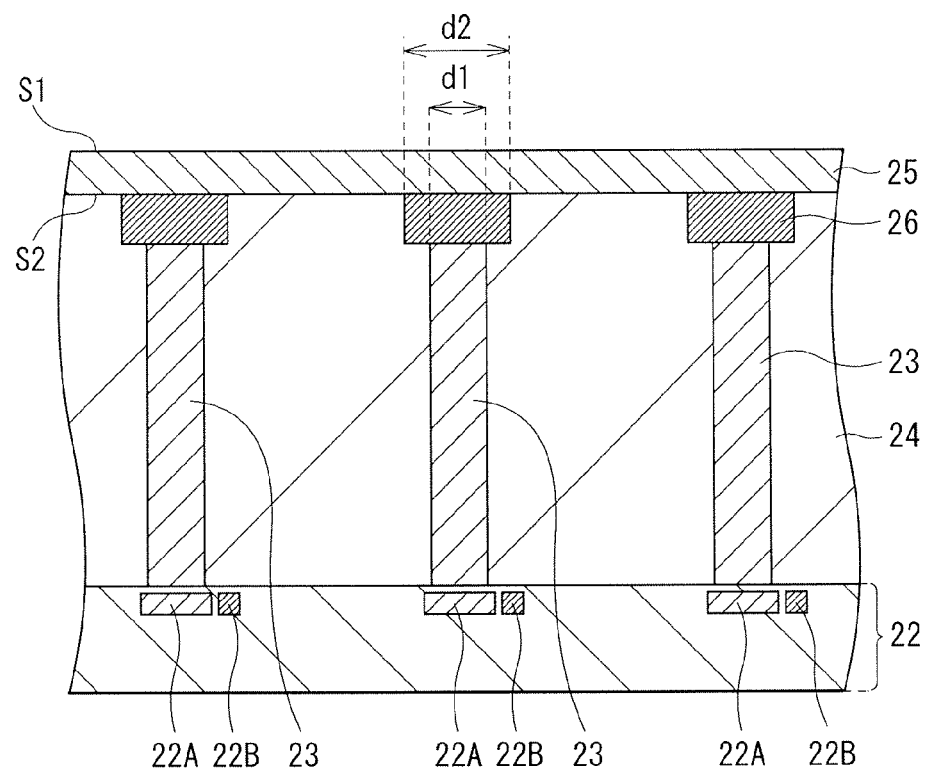
FIG. 10 is a cross-sectional diagram illustrating a configuration of a pixel section according to Modification 1-1.

FIG. 10 illustrates a cross-sectional configuration of a pixel section according to Modification 1-1. In the above-described first embodiment, the shielding layer 26 is provided on the surface S1 of the supporting substrate 25, but the position of the shielding layer 26 is not limited thereto. The shielding layer 26 may be provided on the surface S2 side of the supporting substrate 25, as described in the present modification. In other words, in the present modification, the shielding layer 26 is provided between the supporting substrate 25 and the partition 23. In this case as well, the shielding layer 26 faces the partition 23, and is patterned to be in a grid shape (FIG. 5A) or a stripe shape (FIGS. 5B and 5C). This makes it possible to obtain effects similar to those of the above-described first embodiment. In addition, unevenness is not formed on the surface side (the surface S1 side) of the supporting substrate 25. Therefore, handling ability in a manufacturing process and the like becomes excellent.

Modification 1-2

Figure 11:
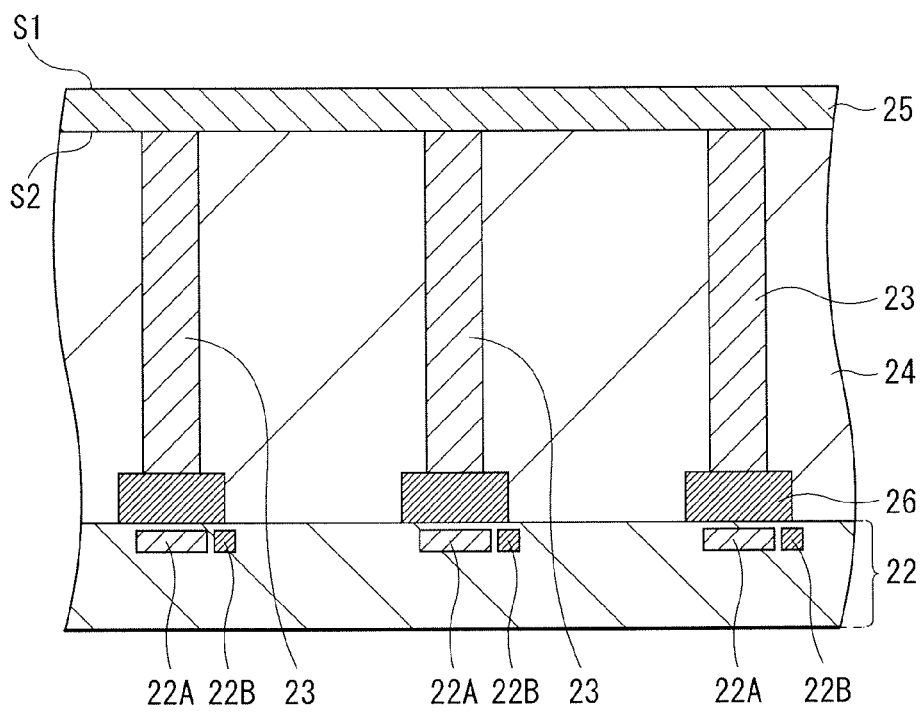
FIG. 11 is a cross-sectional diagram illustrating a configuration of a pixel section according to Modification 1-2.
Figure 11:
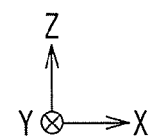

FIG. 11 illustrates a cross-sectional configuration of a pixel section according to Modification 1-2. In the above-described first embodiment, the shielding layer 26 is formed on the surface S1 of the supporting substrate 25, but the position of the shielding layer 26 is not limited thereto. The shielding layer 26 may be provided on the sensor substrate 22, as described in the present modification. In other words, in the present modification, the shielding layer 26 is provided between the sensor substrate 22 and the partition 23. In this case as well, the shielding layer 26 faces the partition 23 and is patterned to be in a grid shape (FIG. 5A) or a stripe shape (FIGS. 5B and 5C). This makes it possible to obtain effects similar to those of the above-described first embodiment. In addition, the shielding layer 26 is disposed closer to the TFT 22B than those of the above-described first embodiment and Modification 1-1. Therefore, it is possible to enhance a radiation shielding effect on the TFT 22B further.

Second Embodiment

Configuration

Figure 12:
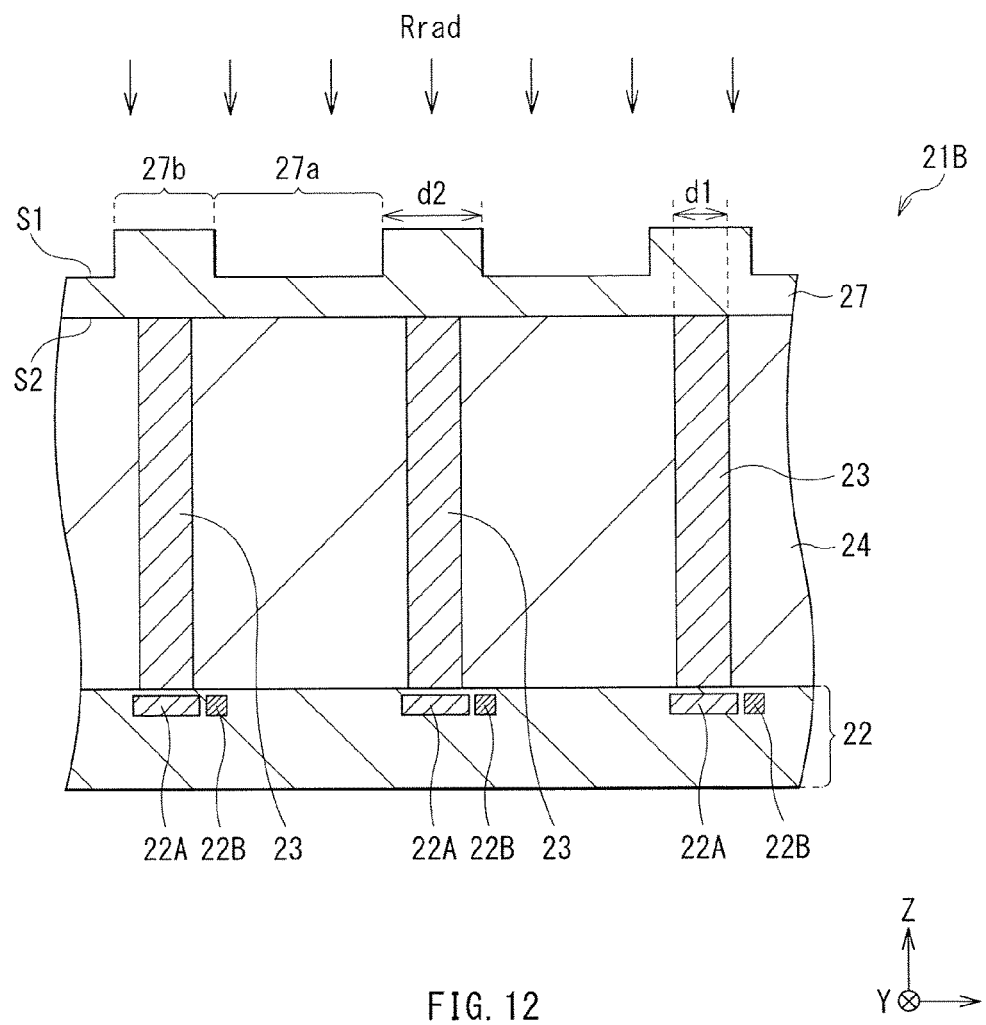
FIG. 12 is a cross-sectional diagram illustrating a configuration of a pixel section of a radiation image-pickup device according to a second embodiment of the present disclosure.

FIG. 12 illustrates a configuration of a pixel section of a radiation image-pickup device according to a second embodiment of the present disclosure. In a manner similar to that of the above-described first embodiment, the pixel section of the present embodiment is driven by the row scanning section 13, the A/D conversion section 14, the column scanning section 15, and the system control section 16 as illustrated in FIG. 1. Further, the pixel section of the present embodiment is configured by adhering the sensor substrate 22 and a radiation conversion substrate 21B to each other, in a manner similar to that of the pixel section 11 of the above-described first embodiment. The partition 23 and the wavelength conversion layer 24 are formed between a supporting substrate 27 of the radiation conversion substrate 21B and the sensor substrate 22.

However, in the present embodiment, an uneven shape including a depression section 27a and a projection section 27b is formed in one surface (here, the surface S1) of the supporting substrate 27. The projection section 27b in this uneven shape has a radiation shielding function similar to that of the shielding layer 26 of the above-described first embodiment. In other words, depending on the material, thickness, and the like of the supporting substrate 27, the depression section 27a is configured to allow the radiation to pass therethrough, and the projection section 27b is configured to shield the radiation. The projection section 27b is formed to face the partition 23. The projection section 27b is in a grid shape similar to that of the shielding layer 26 illustrated in FIG. 5A, or a stripe shape similar to that of the shielding layer 16 illustrated in each of FIGS. 5B and 5C.

Examples of a material of the supporting substrate 27 may include glass, ceramic, metal, semiconductors, and polymer materials similar to those of the supporting substrate 25 of the above-described first embodiment. Above all, a material having a radiation shielding function may be preferably used. Specifically, the examples of the material of the supporting substrate 27 may include: flat glass such as quartz, borosilicate glass, and chemically tempered glass; sapphire; ceramic such as silicon nitride and silicon carbide; semiconductors such as silicon, germanium, gallium arsenide, gallium phosphide, and gallium nitride; and metal such as aluminum (Al), iron (Fe), and copper (Cu), as well as these metallic elements each covered with a metal oxide.

Further, the depression section 27a may have a thickness of, for example, 0.4 mm or more and 1.0 mm or less. The thinner the depression section 27a is, the larger the transmittance of the radiation Rrad is. However, if the depression section 27a is too thin, the depression section 27a may be easily damaged in a manufacturing process. Therefore, the thickness of the depression section 27a may be preferably 0.4 mm or more. As for a thickness of the projection section 27b, the thicker the projection section 27b is, the larger the shielding rate of the radiation Rrad is. It may be sufficient that the thickness of the projection section 27b is, for example, about double to five times the thickness of the depression section 27a. Specifically, the thickness of the projection section 27b is about 0.8 mm or more and 2.0 mm or less. The width d2 of the projection section 27b may be preferably larger than the width d1 of the partition 23, as in the case of the shielding layer 26 of the above-described first embodiment.

Method of Manufacturing

The pixel section of the present embodiment may be manufactured as follows, for example. FIGS. 13A to 15 are schematic diagrams used to describe a method of manufacturing the pixel section of the present embodiment.

Figure 13A:
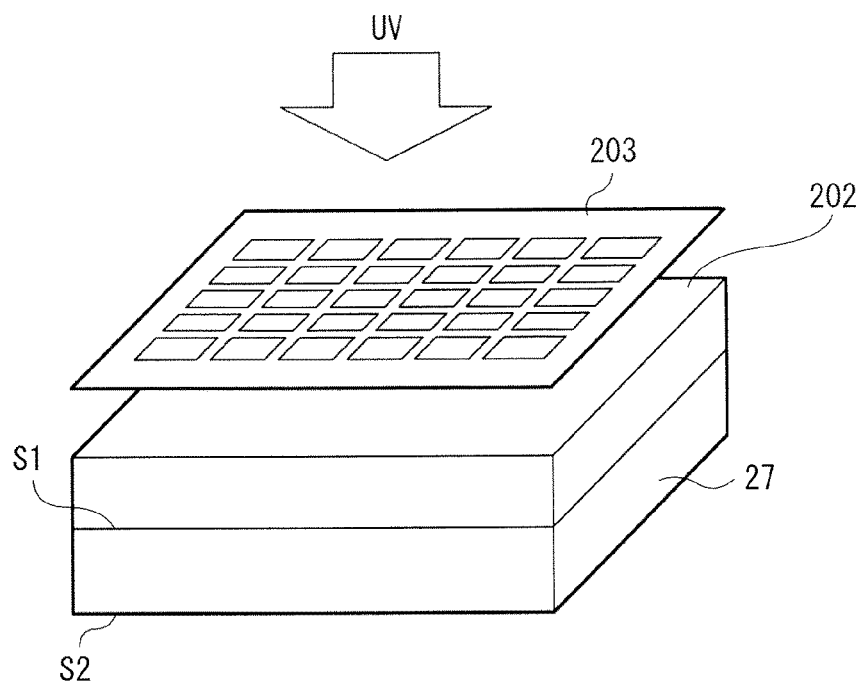
FIG. 13A is a perspective view used to describe a method of manufacturing the pixel section illustrated in FIG. 12.
Figure 13B:
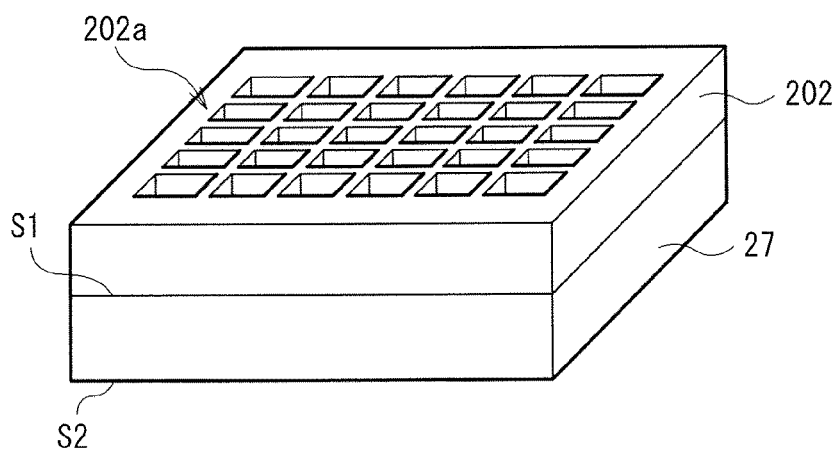
FIG. 13B is a perspective view illustrating a process following a process in FIG. 13A.
Figure 13C:
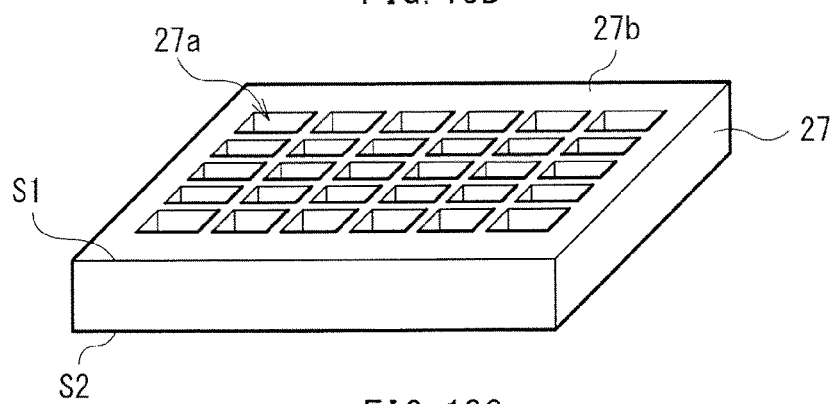
FIG. 13C is a perspective view illustrating a process following the process in FIG. 13B.

First, as illustrated in FIG. 13A, for example, a photoresist 202 made of a dry film resist (DFR) may be attached onto the surface S1 of the supporting substrate 27 made of the above-described material (for example, glass), which is followed by UV exposure using a photomask 203. It is to be noted that the thickness of the supporting substrate 27 at this moment corresponds to the thickness of the projection section 27b. Next, as illustrated in FIG. 13B, processing such as development processing is performed so that a pattern 202a, in which the DFR except a region facing the partition 23 is selectively removed, is formed on the photoresist 202. Subsequently, of the supporting substrate 27, a region facing each opening of the pattern 202a may be recessed by, for example, sandblast, to a predetermined depth, to thin the supporting substrate 27. Afterwards, as illustrated in FIG. 13C, an uneven shape including the depression section 27a and the projection section 27b is formed on the surface S1 of the supporting substrate 27, by peeling off the photoresist 202.

Figure 14:
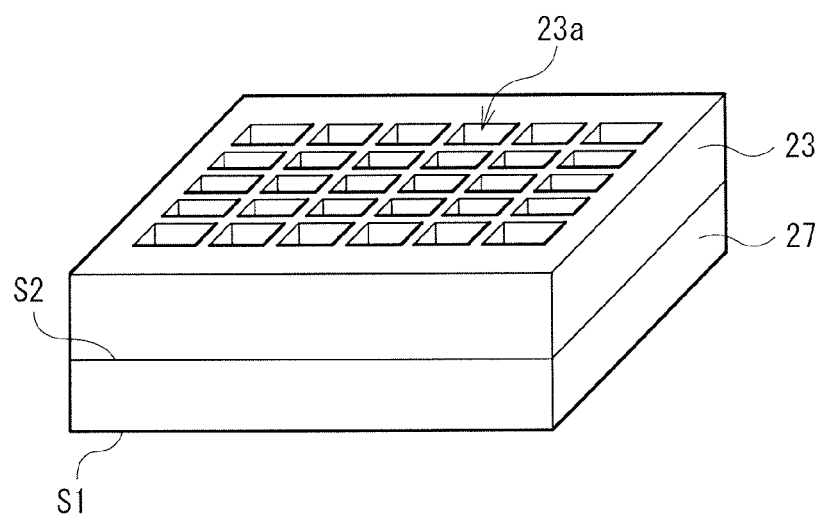
FIG. 14 is a perspective view illustrating a process following the process in FIG. 13C.
Figure 15:
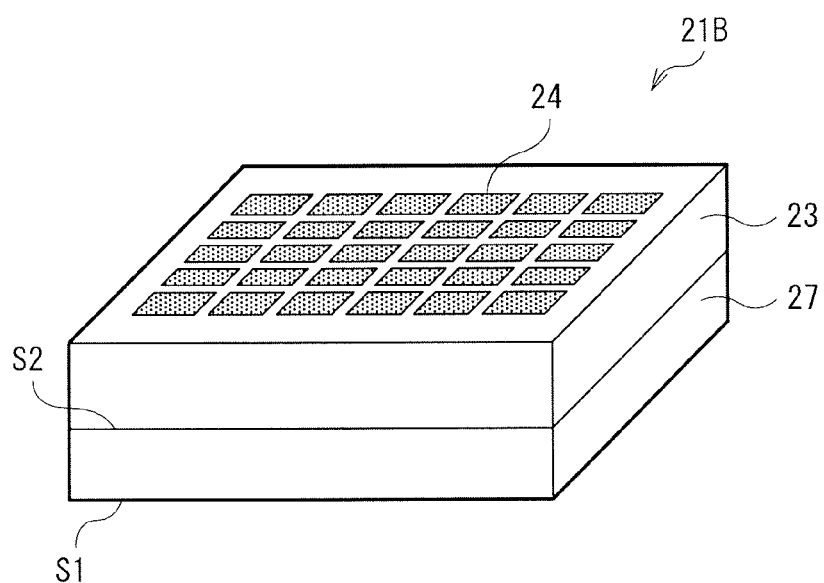
FIG. 15 is a perspective view illustrating a process following the process in FIG. 14.

Next, as illustrated in FIG. 14, the partition 23 is formed on the surface S2 of the supporting substrate 27, in a manner similar to that of the above-described first embodiment. Subsequently, as illustrated in FIG. 15, the wavelength conversion layer 24 is formed in a manner similar to that of the above-described first embodiment. The radiation conversion substrate 21B may be thus formed. Afterwards, although illustration is omitted, it is possible to manufacture the pixel section illustrated in FIG. 12, by adhering the sensor substrate 22 and the radiation conversion substrate 21B to each other.

Functions and Effects

In the present embodiment, in a manner similar to that of the above-described first embodiment, when, for example, the radiation Rrad such as X-rays enters the pixel section, the radiation Rrad may be converted to visible light in the radiation conversion substrate 21B, and this visible light is received by each of the pixels 20 (each of the photoelectric conversion elements 21) in the sensor substrate 22. As a result, in each of the pixels 20, signal charge based on the entering light is generated, and the generated signal charge is read out to the signal line Lsig. The read-out signal charge is transmitted to the outside, as the output data Dout (or inputted to an internal memory not illustrated).

Here, in the present embodiment, an uneven shape is provided on the surface S1 of the supporting substrate 27, and the projection section 27b is provided to face the partition 23. Therefore, the radiation Rrad is allowed to pass through the depression section 27a and shielded by the projection section 27b, of the supporting substrate 27. For this reason, in a manner similar to that of the above-described first embodiment, the radiation is prevented from easily arriving at the TFT 22B through the partition 23 and therefore, it is possible to obtain effects similar to those of the above-described first embodiment.

Modification 2-1

Figure 16:
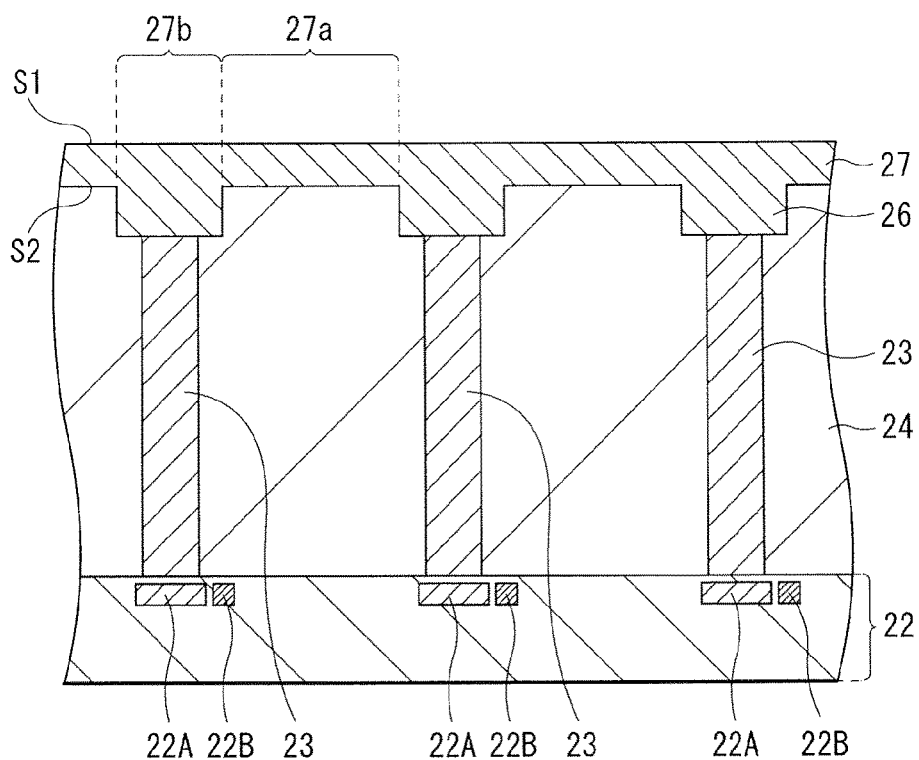
FIG. 16 is a cross-sectional diagram illustrating a configuration of a pixel section according to Modification 2-1.

FIG. 16 illustrates a cross-sectional configuration of a pixel section according to Modification 2-1. In the above-described second embodiment, the uneven shape including the depression section 27a and the projection section 27b is provided on the surface S1 of the supporting substrate 27. However, this uneven shape may be provided on the surface S2 of the supporting substrate 27, as described in the present modification. In other words, in the present modification, the projection section 27b and the partition 23 are provided to be adjacent to each other. In this case as well, the projection section 27b faces the partition 23, and is patterned to be in a grid shape (a grid shape similar to that of the shielding layer 26 in FIG. 5A) or a stripe shape (a stripe shape similar to that of the shielding layer 26 in each of FIGS. 5B and 5C). This makes it possible to obtain effects similar to those of the above-described first embodiment. In addition, unevenness is not formed on the surface side (the surface S1 side) of the supporting substrate 27. Therefore, handling ability in a manufacturing process and the like becomes excellent, as with the above-described Modification 1-1.

Modification 2-2

Figure 17A:
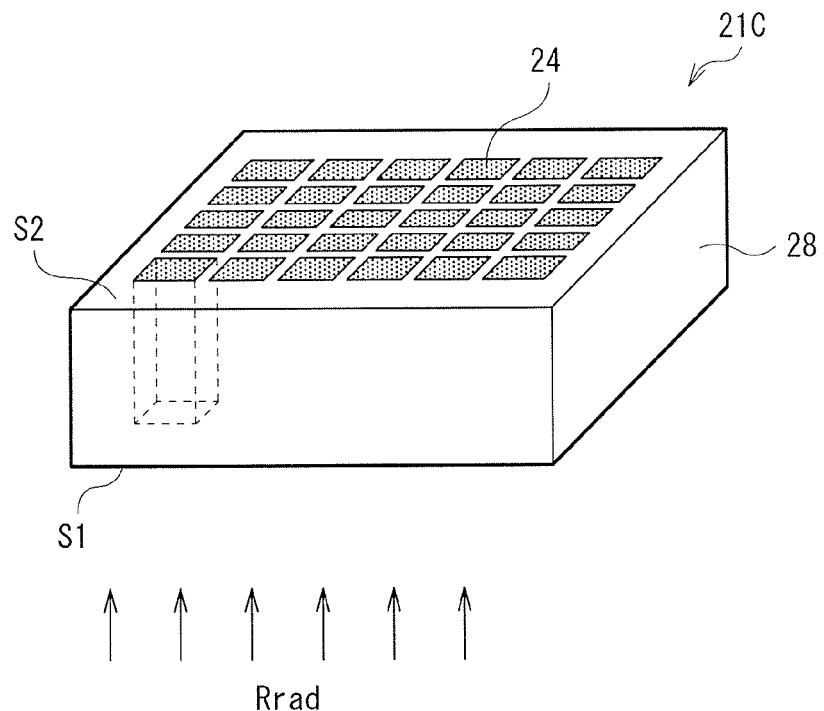
FIG. 17A is a perspective view illustrating a configuration of a radiation conversion substrate according to Modification 2-2.
Figure 17B:
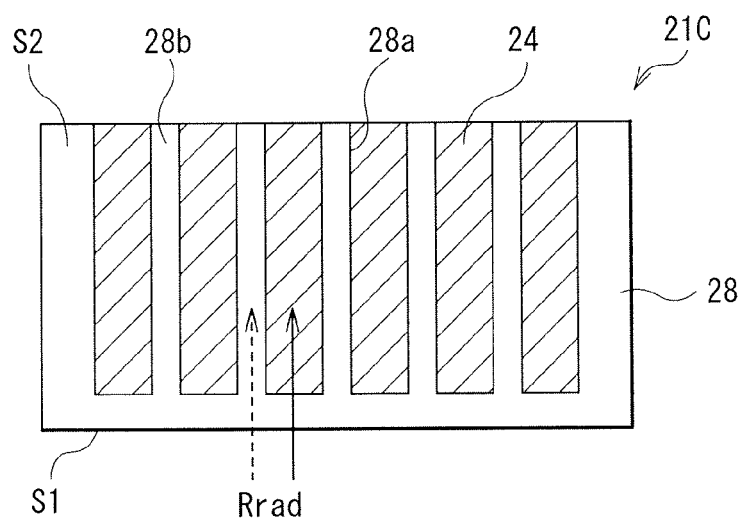
FIG. 17B is a cross-sectional diagram illustrating a configuration of the radiation conversion substrate illustrated in FIG. 17A.

FIG. 17A schematically illustrates a configuration of a radiation conversion substrate (a radiation conversion substrate 21C) according to Modification 2-2. FIG. 17B illustrates a cross-sectional configuration of the radiation conversion substrate 21C. As described in the present modification, a depression section 28a of a supporting substrate 28 may be recessed more deeply than that in the above-described second embodiment. Further, a projection section 28b may have both a function serving as the partition 23 and a function serving as the shielding layer 26 (the projection section 27b), of each of the first and the second embodiments. The wavelength conversion layer 24 is embedded in the depression section 28a. In this case as well, a planar shape of the projection section 28b is a grid shape or a stripe shape. It is to be noted that a material having a radiation shielding effect may be preferably used for the material of the supporting substrate 28, as with the supporting substrate 27 of the above-described second embodiment.

Modification 3

Figure 18:
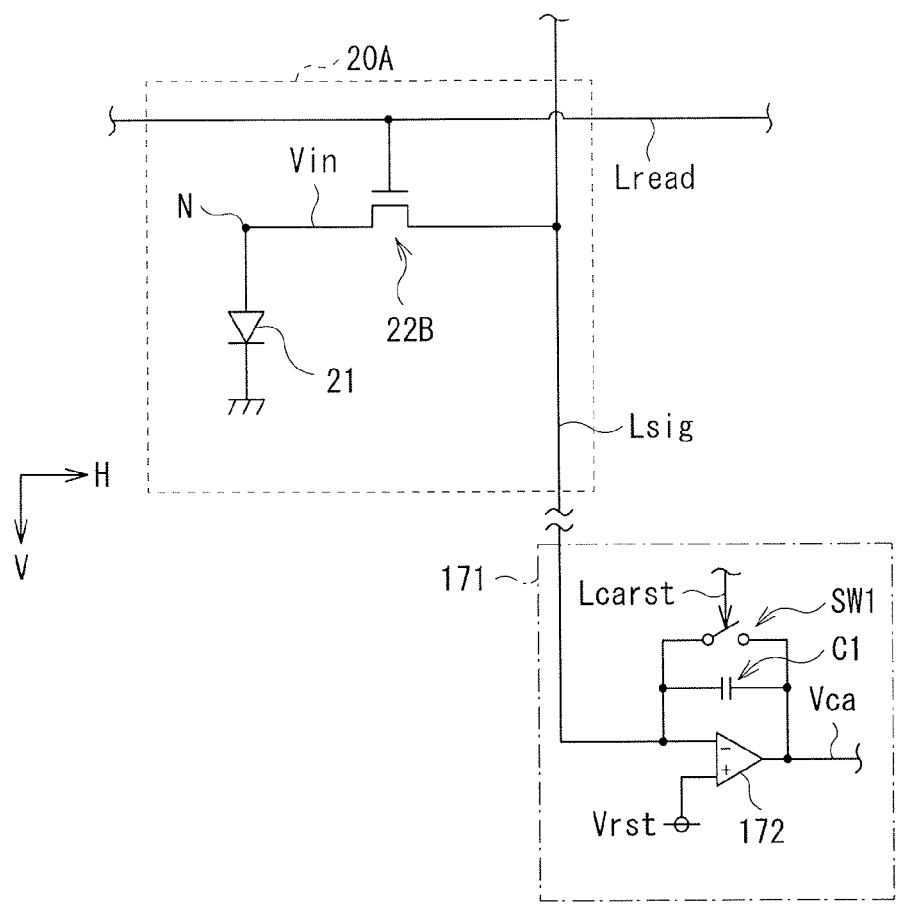
FIG. 18 is a circuit diagram illustrating a configuration of components including a pixel according to Modification 3.

FIG. 18 illustrates a circuit configuration of a pixel (a pixel 20A) according to Modification 3, together with a circuit configuration example of the charge amplifier circuit 171 described in the above-described first embodiment. The pixel 20A of the present modification has a so-called passive circuit configuration as with the pixel 20 of the above-described embodiments, and includes the one photoelectric conversion element 21 and the one TFT 22B. Further, the readout control line Lread extending in the H direction and the signal line Lsig extending in the V direction are connected to the pixel 20A.

However, in the pixel 20A of the present modification, unlike the pixel 20 of the above-described embodiments, an anode of the photoelectric conversion element 21 is connected to the storage node N and a cathode thereof is connected to ground (grounded). In this way, in the pixel 20A, the storage node N may be connected to the anode of the photoelectric conversion element 21.

Modification 4

Figure 19:
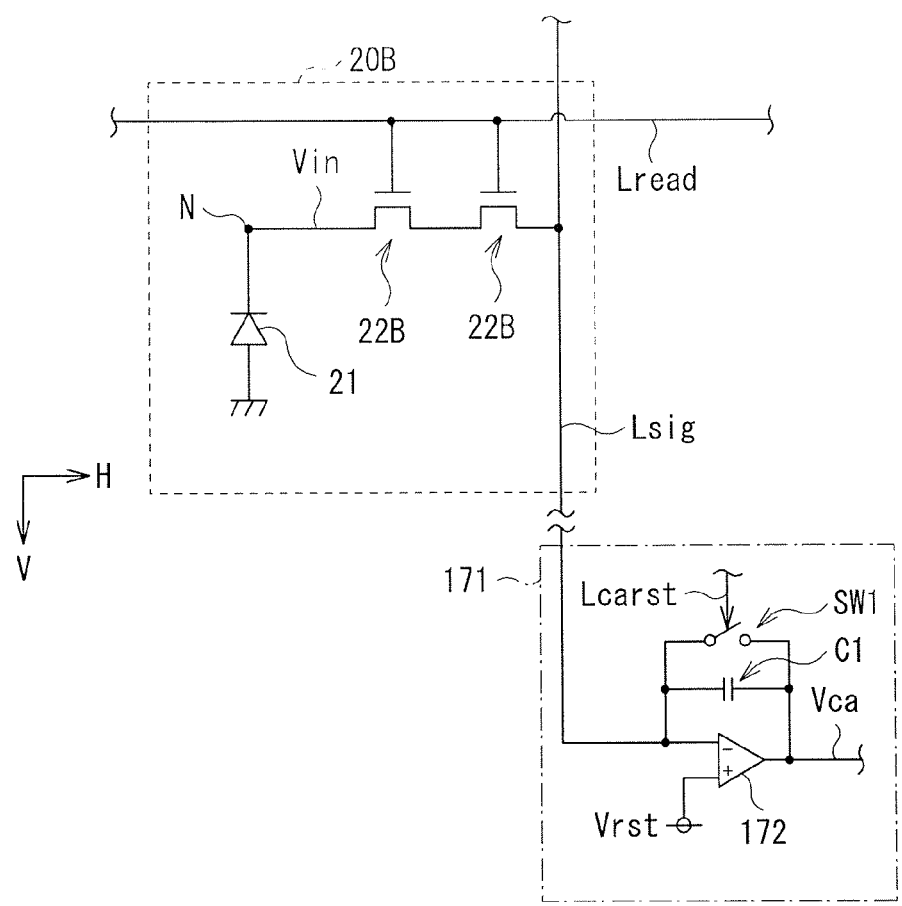
FIG. 19 is a circuit diagram illustrating a configuration of components including a pixel according to Modification 4.

FIG. 19 illustrates a circuit configuration of a pixel (a pixel 20B) according to Modification 4, together with a circuit configuration example of the charge amplifier circuit 171 described in the above-described embodiments. The pixel 20B of the present modification has a so-called passive circuit configuration as with the pixel 20 of the above-described embodiments, and includes the one photoelectric conversion element 21. Further, the pixel 20B is connected to the readout control line Lread extending in the H direction and the signal line Lsig extending in the V direction.

However, in the present modification, the pixel 20B includes the two TFTs 22B. These two TFTs 22B are connected to each other in series (a source or a drain of one of these TFTs is electrically connected to a source or a drain of the other). It is possible to reduce off leak by thus providing the two TFTs 22B in the one pixel 20B.

Modifications 5-1 and 5-2

Figure 20:
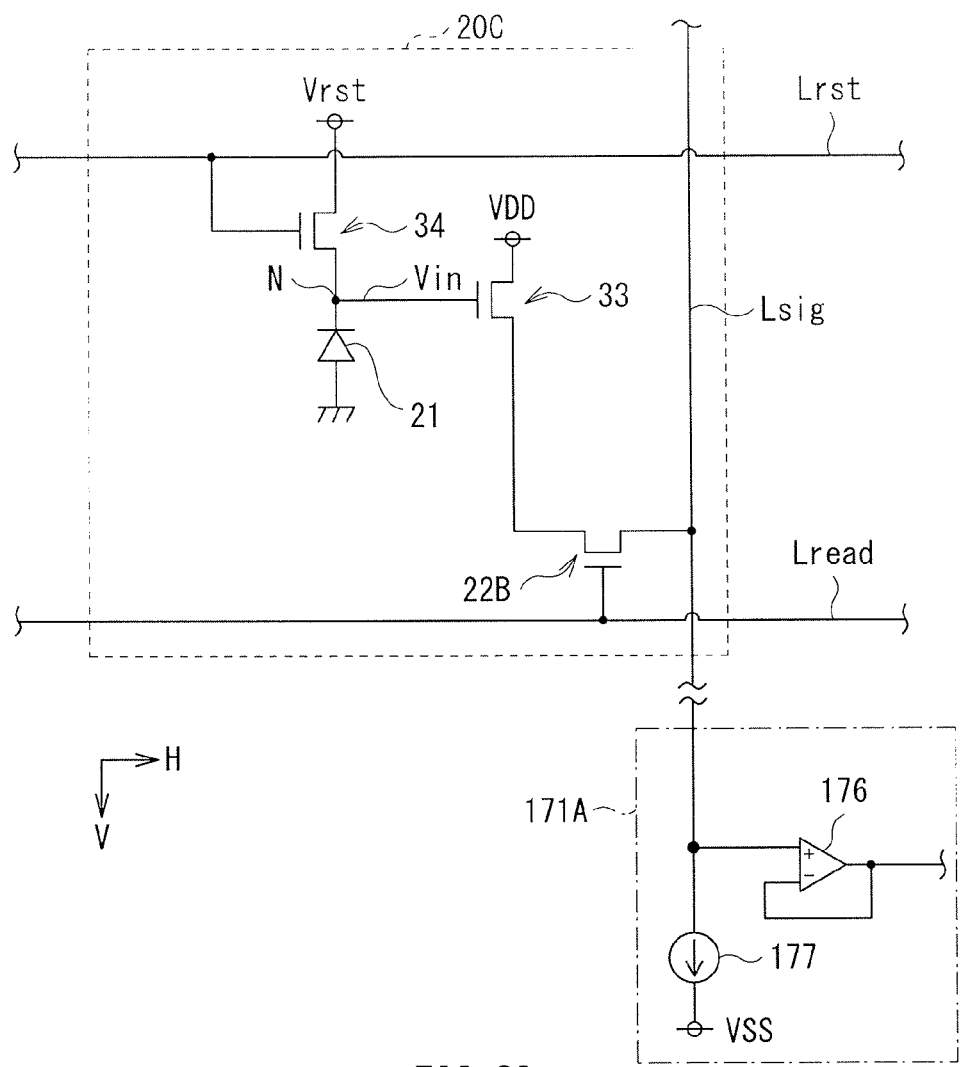
FIG. 20 is a circuit diagram illustrating a configuration of components including a pixel according to Modification 5-1.
Figure 21:
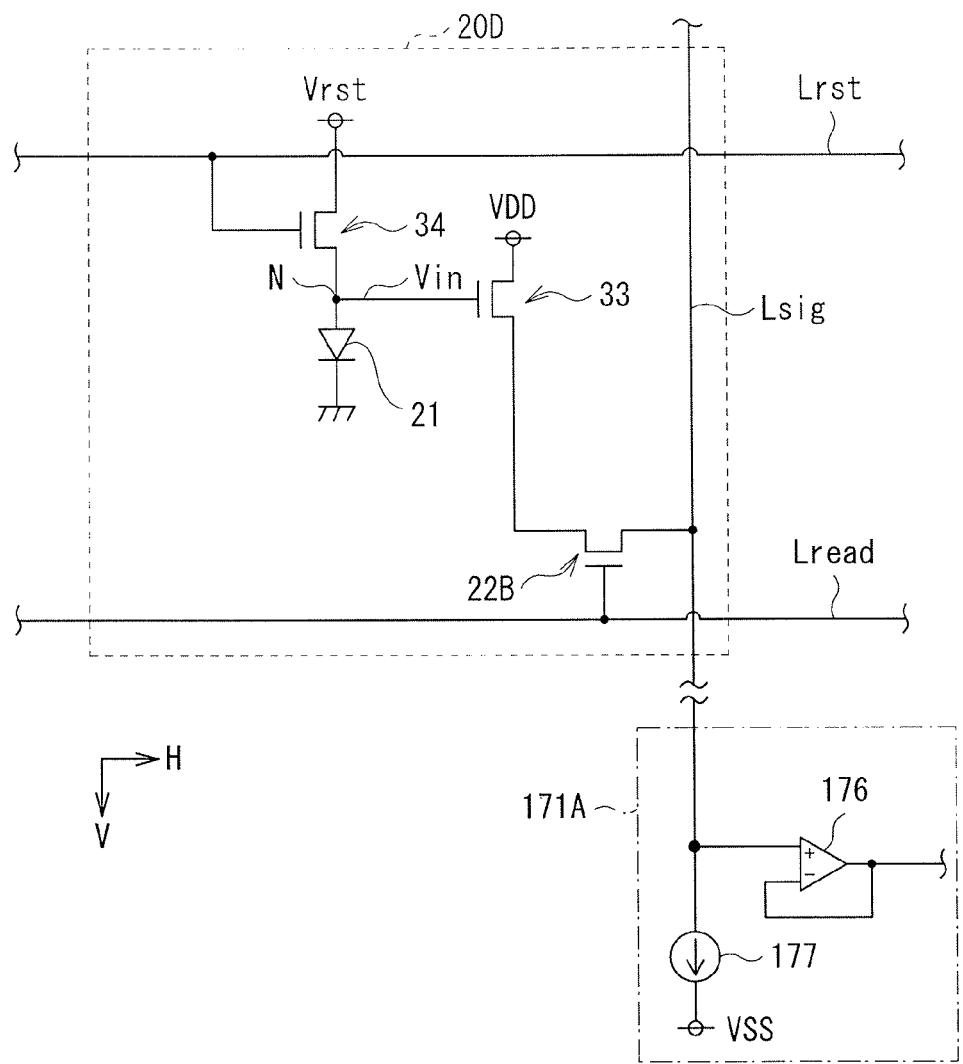
FIG. 21 is a circuit diagram illustrating a configuration of components including a pixel according to Modification 5-2.

FIG. 20 illustrates a circuit configuration of a pixel (a pixel 20C) according to Modification 5-1, together with a circuit configuration example of a charge amplifier circuit 171A that will be described below. Further, FIG. 21 illustrates a circuit configuration of a pixel (a pixel 20D) according to Modification 5-2, together with a circuit configuration example of the charge amplifier circuit 171A. The pixels 20C and 20D according to these Modifications 5-1 and 5-2 each include a so-called active pixel circuit, unlike the above-described pixels 20, 20A, and 20B.

The active pixels 20C and 20D are each provided with the one photoelectric conversion element 21, and three TFTs 22B, 33, and 34. Further, to each of the pixels 20C and 20D, the readout control line Lread as well as a reset control line Lrst extending in the H direction, and the signal line Lsig extending in the V direction are connected.

In each of the pixels 20C and 20D, a gate of the TFT 22B is connected to the readout control line Lread, a source thereof is connected to the signal line Lsig, and a drain thereof is connected to a drain of a transistor 33 included in a source follower circuit. Of the transistor 33, a source is connected to a power supply VDD, and a gate is connected to a cathode (in the example of FIG. 20) or an anode (in the example of FIG. 21) of the photoelectric conversion element 21 and to a drain of a transistor 34 serving as a reset transistor, through the storage node N. A gate of the transistor 34 is connected to the reset control line Lrst, and the reset voltage Vrst is applied to a source thereof. In Modification 5-1, the anode of the photoelectric conversion element 21 is connected to ground. In Modification 5-2, the cathode of the photoelectric conversion element 21 is connected to ground.

Further, in each of these Modifications 5-1 and 5-2, the charge amplifier circuit 171A includes an amplifier 176 and a constant current source 177, in place of the charge amplifier 172, the capacitive element C1, and the switch SW1 in the charge amplifier circuit 171 described earlier. In the amplifier 176, the signal line Lsig is connected to an input terminal on a positive side, an input terminal on a negative side and an output terminal are connected to each other, and a voltage follower circuit is formed. It is to be noted that, one terminal of the constant current source 177 is connected to one-end side of the signal line Lsig, and a power supply VSS is connected to the other terminal of the constant current source 177.

Modification 6

Figure 22:
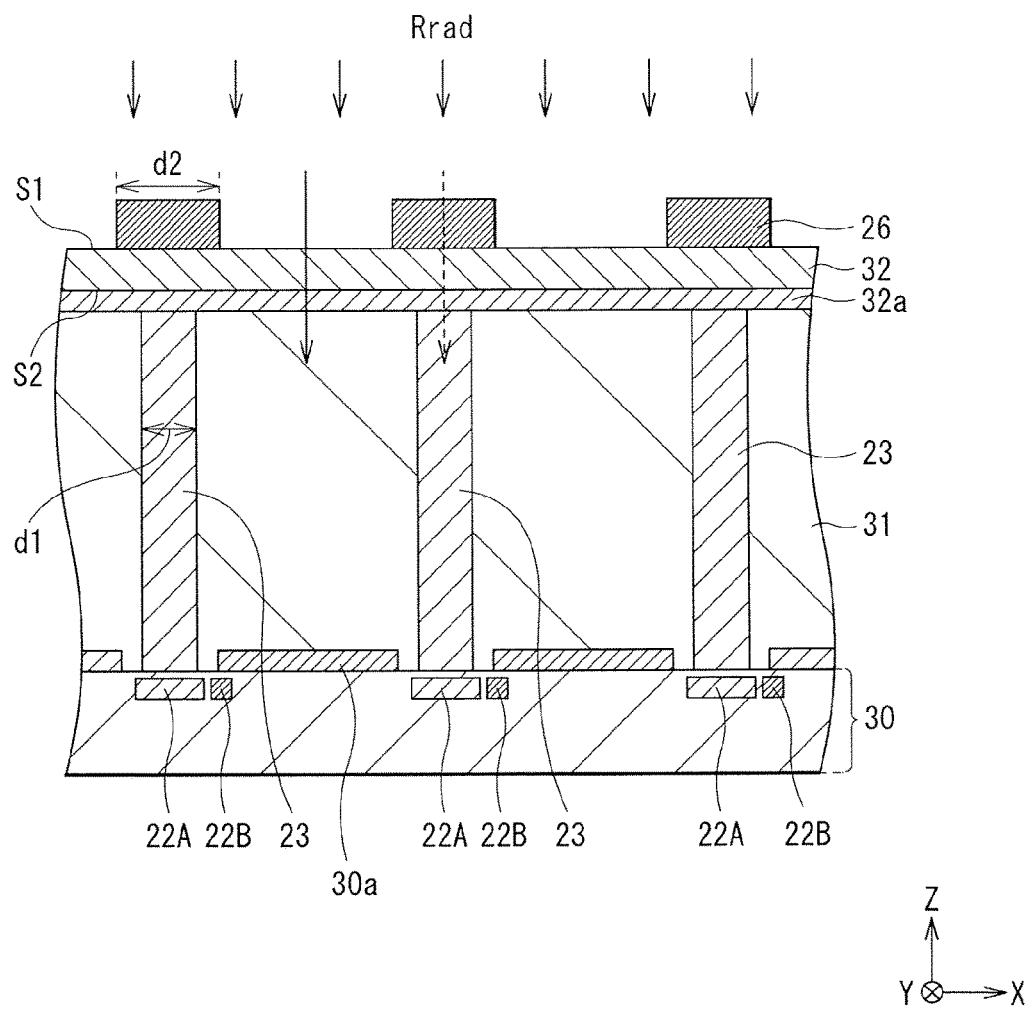
FIG. 22 is a cross-sectional diagram illustrating a configuration of a pixel section according to Modification 6.

FIG. 22 illustrates a cross-sectional configuration of a pixel section according to Modification 6. A pixel section of the present modification is used in a radiation image-pickup device of a direct conversion type, and therefore is different from those of the above-described embodiments and the like in this respect. In the present modification, a direct conversion layer 31 is formed between a first substrate 30 and a second substrate 32. The first substrate 30 includes a pixel circuit (not illustrated) used to read signal charge. Further, on an uppermost surface of the first substrate 30, a charge collection electrode 30a is provided for each pixel. On a surface of the second substrate 32, the surface being on the direct conversion 31 side, a bias electrode 32a is provided.

The direct conversion layer 31 is partitioned by the partition 23 for each pixel, and has a function of absorbing the radiation Rrad that has entered, and converting the absorbed radiation Rrad to an electric signal. The direct conversion layer 31 may be configured using, for example, a material such as an amorphous selenium (a-Se) semiconductor and a cadmium tellurium (CdTe) semiconductor. It is to be noted that this pixel circuit in the case of the direct conversion type is equivalent to a case in which the photoelectric conversion element 21 among the components of the pixel 20 illustrated in FIG. 2 is replaced with a capacitor. Signal charge generated in the direct conversion layer 31 is read out through the charge collection electrode 30a. In such a pixel configuration of the direct conversion type as well, it is possible to obtain effects similar to those of the above-described first embodiment.

Application Example

The radiation image-pickup device according to any of the above-described embodiments and modifications is applicable to a radiation image-pickup display system as will be described below.

Figure 23:
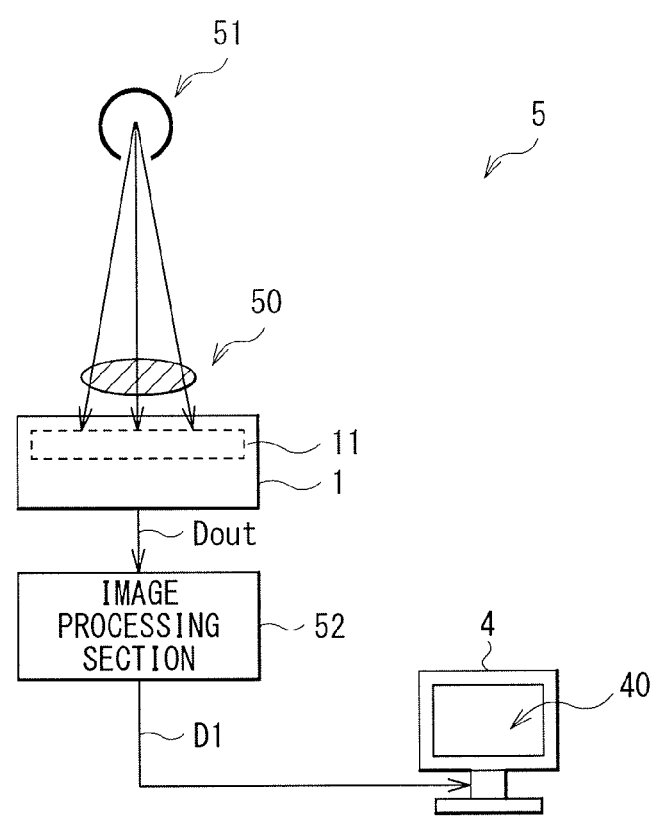
FIG. 23 is a schematic diagram illustrating a schematic configuration of a radiation image-pickup display system according to an application example.

FIG. 23 schematically illustrates a schematic configuration example of a radiation image-pickup display system (a radiation image-pickup display system 5) according to an application example. The radiation image-pickup display system 5 includes the radiation image-pickup device 1, an image processing section 52, and a display 4. The radiation image-pickup device 1 includes the pixel section 11 and the like according to any of the above-described embodiments and the like.

The image processing section 52 generates image data D1, by performing predetermined image processing on the output data Dout (the image pickup signal) outputted from the radiation image-pickup device 1. Based on the image data D1 generated in the image processing section 52, the display 4 displays an image on a predetermined monitor screen 40.

In the radiation image-pickup display system 5, based on radiation emitted towards a subject 50 from a radiation source 51 such as an X-ray source, the radiation image-pickup device 1 obtains image data Dout of the subject 50, and outputs the obtained image data Dout to the image processing section 52. The image processing section 52 performs the above-described predetermined image processing on the inputted image data Dout, and outputs the image data (display data) D1 after the image processing, to the display 4. The display 4 displays an image (a picked-up image) on the monitor screen 40 based on the inputted image data D1.

In this way, in the radiation image-pickup display system 5 of the present application example, the radiation image-pickup device 1 is allowed to obtain an image of the subject 50 as an electric signal. Therefore, it is possible to display the image by transmitting the obtained electric signal to the display 4. In other words, it is possible to observe an image of the subject 50 without using a radiographic film. In addition, it is also possible to support moving-image taking and moving-image display.

Some embodiments, modifications, and application example have been described above, but the contents of the present disclosure are not limited thereto, and may be variously modified. For example, the circuit configuration of the pixel in the pixel section of each of the above-described embodiments and the like is not limited to those (the circuit configuration of each of the pixels 20, and 20A to 20D) described above, and may be other circuit configuration. Similarly, the circuit configuration of each of other components such as the row scanning section and the column selection section is not limited to those of the above-described embodiments and the like, and may be other circuit configuration.

Further, the pixel section, the row scanning section, the A/D conversion section (the column selection section), the column scanning section, and the like of each of the above-described embodiments and the like may be formed, for example, on the same substrate. Specifically, for example, using a polycrystalline semiconductor such as low temperature poly-silicon, the switch and the like in these circuit portions may be formed on the same substrate. Therefore, for example, driving operation on the same substrate may be performed based on a control signal from an external system control section, which allows achievement of a slim bezel (a frame structure in which three sides are free) and an improvement in reliability in wiring connection.

Further, any combinations of the configurations, methods, processes, shapes, materials, and numerical values described above in the embodiments are allowed without deviating from the spirit of the present disclosure.

It is possible to achieve at least the following configurations from the above-described example embodiments of the disclosure.

(1) A radiation image-pickup device including:
    a plurality of pixels configured to generate signal charge based on radiation;
    a first substrate including a transistor configured to read out the signal charge;
    a second substrate disposed to face the first substrate;
    a conversion layer provided between the first substrate and the second substrate, the conversion layer being provided for each of the pixels, and being configured to convert the radiation to other wavelength or an electric signal;
a partition provided between the first substrate and the second substrate, to partition the conversion layer for each of the pixels; and
a radiation shielding layer provided to face the partition.

(2) The radiation image-pickup device according to (1), wherein the radiation shielding layer is provided between the second substrate and the partition.

(3) The radiation image-pickup device according to (1), wherein the radiation shielding layer is provided on a side of the second substrate, the side being opposite to the partition.

(4) The radiation image-pickup device according to (1), wherein the radiation shielding layer is provided between the first substrate and the partition.

(5) The radiation image-pickup device according to (1), wherein
the second substrate has an uneven shape on at least one surface, and
the radiation shielding layer is configured using a projection section of the uneven shape.

(6) The radiation image-pickup device according to (5), wherein the second substrate has the uneven shape on a surface on the partition side.

(7) The radiation image-pickup device according to (6), wherein the projection section of the uneven shape also serves as the partition.

(8) The radiation image-pickup device according to any one of (5) to (7), wherein the second substrate has the uneven shape on a surface on a side opposite to the partition.

(9) The radiation image-pickup device according to any one of (1) to (8), wherein the radiation shielding layer has a width larger than the partition, in a plane parallel to the second substrate.

(10) The radiation image-pickup device according to any one of (1) to (9), wherein
a signal line and a scanning line are provided in a region of the first substrate, the region facing the partition, and
the signal line and the scanning line being configured to read out the signal charge for each of the pixels, and
the radiation shielding layer has a stripe shape facing one of the signal line and the scanning line.

(11) The radiation image-pickup device according to any one of (1) to (9), wherein
a signal line and a scanning line are provided in a region of the first substrate, the region facing the partition, and
the signal line and the scanning line being configured to read out the signal charge for each of the pixels, and
the radiation shielding layer has a grid shape facing both of the signal line and the scanning line.

(12) The radiation image-pickup device according to any one of (1) to (11), wherein the transistor includes a semiconductor layer including low temperature poly-silicon.

(13) The radiation image-pickup device according to any one of (1) to (12), wherein
the plurality of pixels each include a photoelectric conversion element, and
the conversion layer converts the radiation to a wavelength in a sensitivity range of the photoelectric conversion element.

(14) The radiation image-pickup device according to (13), wherein the photoelectric conversion element is configured using a PIN photodiode or a MIS sensor.

(15) The radiation image-pickup device according to any one of (1) to (12), wherein the conversion layer generates the electric signal by absorbing the radiation.

(16) The radiation image-pickup device according to any one of (1) to (15), wherein the radiation includes X-rays.

(17) A radiation image-pickup display system including:
a radiation image-pickup device; and
a display configured to perform image display based on an image pickup signal obtained by the radiation image-pickup device,
wherein the radiation image-pickup device includes,
a plurality of pixels configured to generate signal charge based on radiation,
a first substrate including a transistor configured to read out the signal charge,
a second substrate disposed to face the first substrate,
a conversion layer provided between the first substrate and the second substrate, the conversion layer being provided for each of the pixels, and being configured to convert the radiation to other wavelength or an electric signal,
a partition provided between the first substrate and the second substrate, to partition the conversion layer for each of the pixels, and
a radiation shielding layer provided to face the partition.

It should be understood by those skilled in the art that various modifications, combinations, sub-combinations, and alterations may occur depending on design requirements and other factors insofar as they are within the scope of the appended claims or the equivalents thereof.

What is claimed is:

1. A radiation image-pickup device with a plurality of pixels configured to generate signal charge based on radiation, the device comprising:
first and second substrates facing each other, the first substrate being a sensor substrate and the second substrate being a supporting substrate;
a conversion layer and a partition provided between the first substrate and the second substrate, the conversion layer horizontally partitioned by the partition into sections according to the pixels, each section of the conversion layer configured to convert the radiation to radiation of another wavelength or to an electric signal;
wiring in the first substrate, the wiring vertically being aligned with the partition; and
a radiation shielding layer vertically aligned with the partition and the wiring,
wherein,
the second substrate is in contact with the conversion layer,
the radiation shielding layer partitions the radiation in conformity with the partitioning of the conversion layer by the partition,
the partition and the second substrate are separate from each other, and
the first substrate includes readout circuitry for reading out the signal charge from the pixels.

2. The radiation image-pickup device according to claim 1, wherein the radiation shielding layer is provided on a side of the second substrate that faces the partition.

3. The radiation image-pickup device according to claim 1, wherein the radiation shielding layer is provided on a side of the second substrate that faces away from the partition.

4. The radiation image-pickup device according to claim 1, wherein the radiation shielding layer is provided between the first substrate and the partition.

5. The radiation image-pickup device according to claim 1, wherein
the second substrate has an uneven shape on at least one surface, and the radiation shielding layer is configured using a projection section of the uneven shape.

6. The radiation image-pickup device according to claim 5, wherein the second substrate has the uneven shape on a surface on the partition side.

7. The radiation image-pickup device according to claim 6, wherein the projection section of the uneven shape also serves as the partition.

8. The radiation image-pickup device according to claim 5, wherein the second substrate has the uneven shape on a surface on a side opposite to the partition.

9. The radiation image-pickup device according to claim 1, wherein the radiation shielding layer has a width larger than the partition, in a plane parallel to the second substrate.

10. The radiation image-pickup device according to claim 1, wherein the wiring includes a signal line and a scanning line, the signal line and the scanning line being configured to read out the signal charge for each of the pixels.

11. The radiation image-pickup device according to claim 1, wherein the readout circuitry includes a transistor which includes a semiconductor layer including low temperature poly-silicon, the transistor being overlapped by the radiation shielding layer.

12. The radiation image-pickup device according to claim 1, wherein:
each pixel includes a respective photoelectric conversion element, and
the conversion layer section of each pixel converts the radiation to a wavelength in a sensitivity range of the photoelectric conversion element of the pixel.

13. The radiation image-pickup device according to claim 12, wherein each photoelectric conversion element is configured using a PIN photodiode or a MIS sensor.

14. The radiation image-pickup device according to claim 1, wherein each section of the conversion layer generates the electric signal by absorbing the radiation.

15. The radiation image-pickup device according to claim 1, wherein the radiation includes X-rays.

16. A radiation image-pickup display system comprising:
a radiation image-pickup device according to claim 1; and
a display configured to perform image display based on an image pickup signal obtained by the radiation image-pickup device.

* * * * *